US012765184B2

(12) United States Patent
Kawamura

(10) Patent No.: US 12,765,184 B2
(45) Date of Patent: Oct. 13, 2026

(54) DISPLAY DEVICE

(71) Applicant: Magnolia White Corporation, Tokyo (JP)

(72) Inventor: Shinichi Kawamura, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 398 days.

(21) Appl. No.: 18/592,498

(22) Filed: Feb. 29, 2024

(65) Prior Publication Data

US 2024/0334748 A1 Oct. 3, 2024

(30) Foreign Application Priority Data

Mar. 29, 2023 (JP) ................................ 2023-053376

(51) Int. Cl.
*H10K 59/122* (2023.01)
*G09G 3/3225* (2016.01)

(52) U.S. Cl.
CPC ......... *H10K 59/122* (2023.02); *G09G 3/3225* (2013.01); *G09G 2300/0452* (2013.01); *G09G 2300/0842* (2013.01)

(58) Field of Classification Search
CPC ........... H10K 59/122; H10K 59/80515; H10K 59/80521; H10K 59/12; H10K 59/1201; H10K 59/131; G09G 3/3225; G09G 2300/0452; G09G 2300/0842
See application file for complete search history.

(56) References Cited

U.S. PATENT DOCUMENTS

| | | | |
|---|---|---|---|
| 2004/0160170 A1 | 8/2004 | Sato et al. | |
| 2009/0009069 A1 | 1/2009 | Takata | |
| 2019/0363275 A1 | 11/2019 | Ochi et al. | |
| 2022/0077251 A1 | 3/2022 | Choung et al. | |
| 2025/0294967 A1* | 9/2025 | He ...................... | H10K 59/122 |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |
| JP | 2009-032673 A | 2/2009 |
| JP | 2010-118191 A | 5/2010 |
| WO | 2018/179308 A1 | 10/2018 |

* cited by examiner

*Primary Examiner* — Anne M Hines
*Assistant Examiner* — Jose M Diaz
(74) *Attorney, Agent, or Firm* — XSENSUS LLP

(57) ABSTRACT

According to one embodiment, a display device includes a lower electrode, a rib including a pixel aperture, a partition which includes a conductive bottom portion, a stem portion and a top portion, an organic layer which covers the lower electrode through the pixel aperture, and an upper electrode which covers the organic layer. The partition includes a first portion extending in a first direction. The bottom portion of the first portion includes a first end portion on a pixel aperture side, and a second end portion located on a side opposite to the first end portion. Further, the first end portion is exposed from the stem portion. The second end portion is covered with the stem portion.

20 Claims, 22 Drawing Sheets

DISPLAY DEVICE

CROSS-REFERENCE TO RELATED APPLICATION

This application is based upon and claims the benefit of priority from Japanese Patent Application No. 2023-053376, filed Mar. 29, 2023, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer.

In a display area in which a plurality of display elements are provided, feeding lines for supplying electricity to upper electrodes are formed. For example, in terms of the improvement of the yield, a structure which connects the feeding lines and the upper electrodes has room for improvement in various ways. For example, when a feeding line is in contact with an organic layer, leak current flows in the organic layer, and a display failure could occur. In a structure in which both a portion where a feeding line should be connected to an upper electrode and a portion where a feeding line should not be connected to an upper electrode are present in a display area, in some cases, it is difficult to accurately control the connection between feeding lines and upper electrodes at the time of manufacturing.

DETAILED DESCRIPTION

Figure 1:
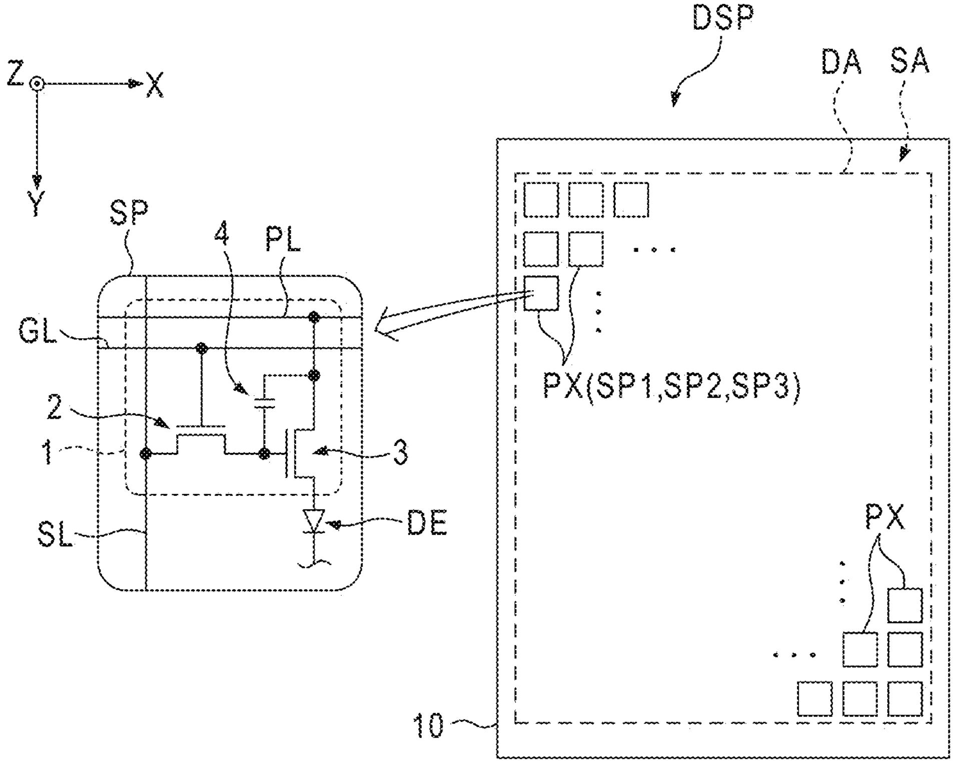
FIG. 1 is a diagram showing a configuration example of a display device according to a first embodiment.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. The third direction Z is a normal direction relative to a plane including the first direction X and the second direction Y. When various elements are viewed parallel to the third direction Z, the appearance is defined as a plan view.

The display device of each embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

First Embodiment

FIG. 1 is a diagram showing a configuration example of a display device DSP according to a first embodiment. The display device DSP comprises a display area DA which displays an image and a surrounding area SA around the display area DA on an insulating substrate 10. The substrate 10 may be glass or a resinous film having flexibility.

In the embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP. For example, each pixel PX includes a blue subpixel SP1, a green subpixel SP2 and a red subpixel SP3. Each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. The pixel switch 2 and the drive transistor 3 are, for example, switching elements consisting of a thin-film transistor.

The gate electrode of the pixel switch 2 is connected to a scanning line GL. One of the source electrode and drain electrode of the pixel switch 2 is connected to a signal line SL. The other one is connected to the gate electrode of the drive transistor 3 and the capacitor 4. In the drive transistor 3, one of the source electrode and the drain electrode is connected to a power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

Figure 2:
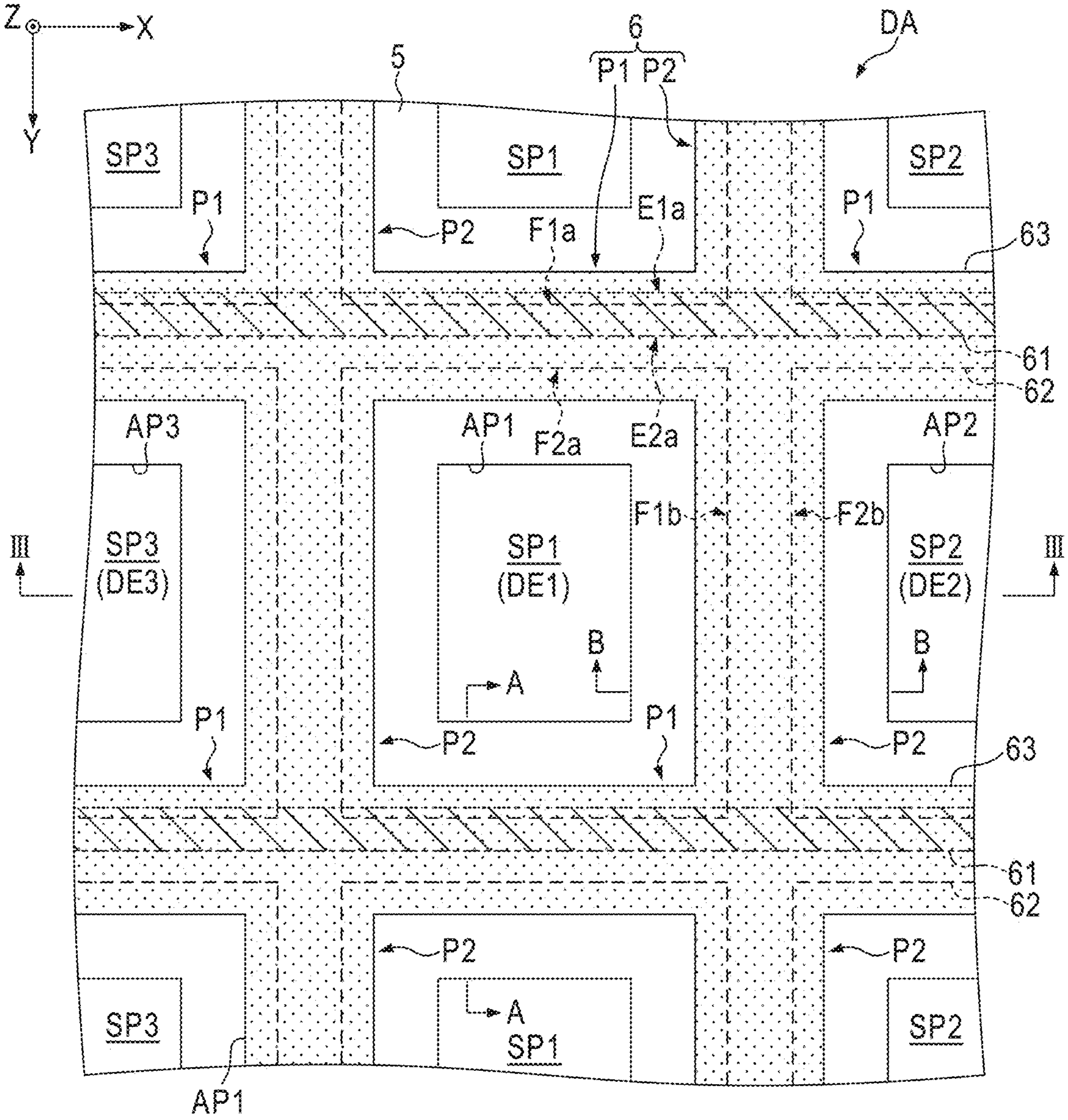
FIG. 2 is a schematic plan view of the display area of the display device according to the first embodiment.

FIG. 2 is a schematic plan view of the display area DA. In the example of FIG. 2, subpixels SP1, SP2 and SP3 are arranged in the first direction X. A plurality of subpixels SP1 are arranged in the second direction Y. A plurality of subpixels SP2 are arranged in the second direction Y. A plurality of subpixels SP3 are arranged in the second direction Y. It should be noted that the layout of subpixels SP1, SP2 and SP3 is not limited to the example of FIG. 2.

A rib 5 and a partition 6 are provided in the display area DA. The rib 5 comprises pixel apertures AP1, AP2 and AP3 in subpixels SP1, SP2 and SP3, respectively. In areas overlapping the pixel apertures AP1, AP2 and AP3, display elements DE1, DE2 and DE3 are formed, respectively.

The partition 6 comprises a plurality of first portions P1 extending in the first direction X and a plurality of second portions P2 extending in the second direction Y. Both the first portions P1 and the second portions P2 are provided on the rib 5.

In the example of FIG. 2, the first portions P1 and the second portions P2 are connected to each other. By this configuration, the planar shape of the partition 6 is a grating shape which surrounds the pixel apertures AP1, AP2 and AP3 (subpixels SP1, SP2 and SP3). In other words, the partition 6 comprises apertures in subpixels SP1, SP2 and SP3 in a manner similar to that of the rib 5.

As described in detail later, the partition 6 includes a bottom portion 61, a stem portion 62 located on the bottom portion 61 and a top portion 63 located on the stem portion 62. In FIG. 2, a diagonal pattern is added to the bottom portion 61, and a dotted pattern is added to the top portion 63. The outer shape of the stem portion 62 is shown by broken lines.

The first portion P1 includes the bottom portion 61, the stem portion 62 and the top portion 63. In the embodiment, the second portion P2 includes the stem portion 62 and the top portion 63. However, the second portion P2 does not include the bottom portion 61.

Figure 3:
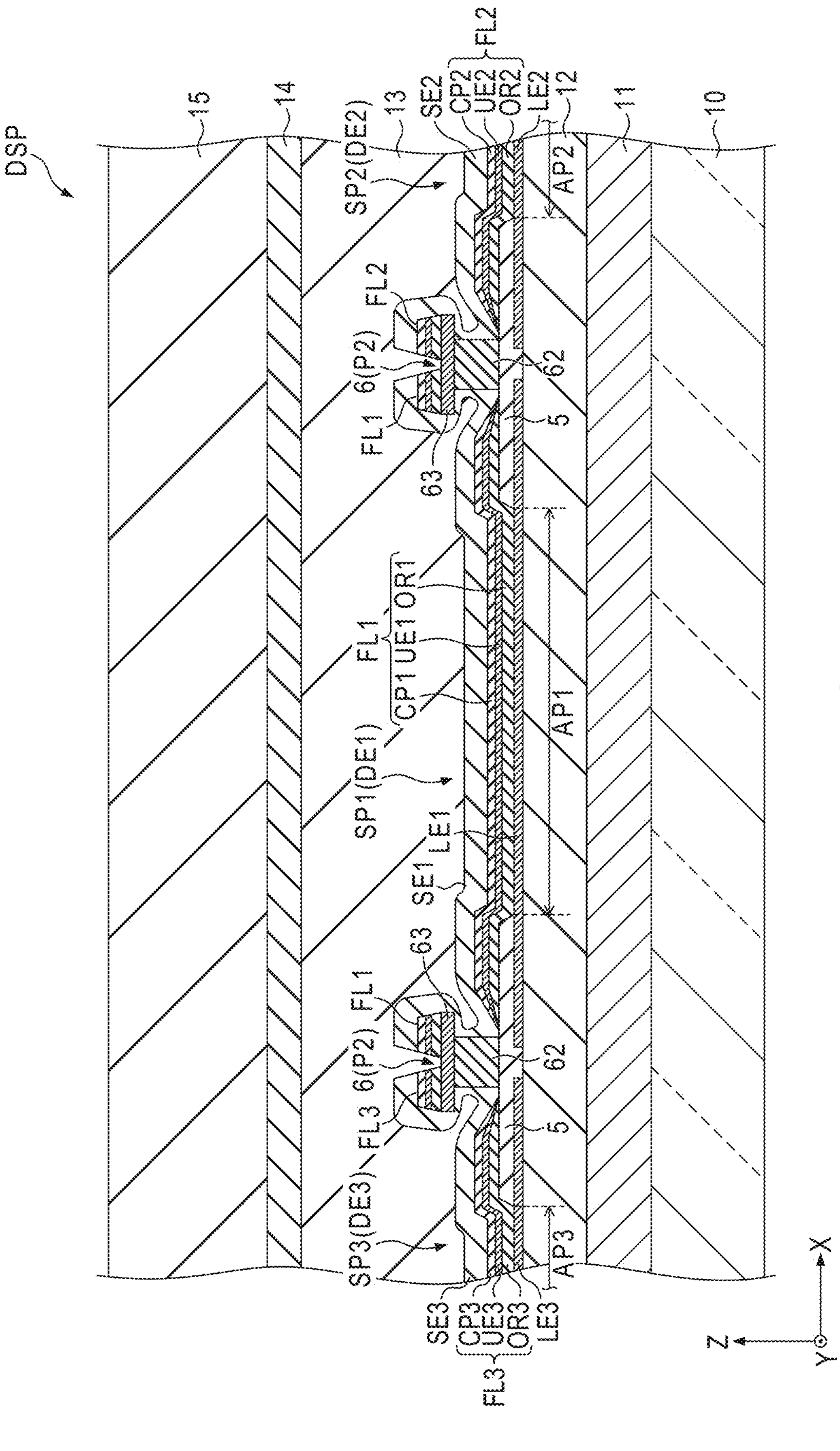
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuit 1, scanning line GL, signal line SL and power line PL shown in FIG. 1. The circuit layer 11 is covered with an insulating layer 12. The insulating layer 12 functions as a planarization film which planarizes the irregularities formed by the circuit layer 11.

The lower electrode LE1 of subpixel SP1, the lower electrode LE2 of subpixel SP2 and the lower electrode LE3 of subpixel SP3 are provided on the insulating layer 12. The rib 5 is provided on the insulating layer 12 and the lower electrodes LE1, LE2 and LE3. The end portions of the lower electrodes LE1, LE2 and LE3 are covered with the rib 5.

The partition 6 shown in FIG. 3 corresponds to the second portion P2 shown in FIG. 2. The top portion 63 of the partition 6 has a width greater than that of the stem portion 62. By this configuration, in FIG. 3, the both end portions of the top portion 63 protrude relative to the side surfaces of the stem portion 62. This shape of the partition 6 is called an overhang shape.

A thin film FL1 is provided in subpixel SP1. A thin film FL2 is provided in subpixel SP2. A thin film FL3 is provided in subpixel SP3. The thin films FL1, FL2 and FL3 are formed by, for example, vapor deposition. In the embodiment, the thin film FL1 includes an organic layer OR1, an upper electrode UE1 and a cap layer CP1. The thin film FL2 includes an organic layer OR2, an upper electrode UE2 and a cap layer CP2. The thin film FL3 includes an organic layer OR3, an upper electrode UE3 and a cap layer CP3.

The organic layer OR1 covers the lower electrode LE1 through the pixel aperture AP1. The upper electrode UE1 covers the organic layer OR1 and faces the lower electrode LE1. The cap layer CP1 covers the upper electrode UE1.

The organic layer OR2 covers the lower electrode LE2 through the pixel aperture AP2. The upper electrode UE2 covers the organic layer OR2 and faces the lower electrode LE2. The cap layer CP2 covers the upper electrode UE2.

The organic layer OR3 covers the lower electrode LE3 through the pixel aperture AP3. The upper electrode UE3 covers the organic layer OR3 and faces the lower electrode LE3. The cap layer CP3 covers the upper electrode UE3.

The lower electrodes LE1, LE2 and LE3 are connected to the pixel circuits 1 (see FIG. 1) included in the circuit layer 11 through contact holes provided in the insulating layer 12. The partition 6 function as feeding lines for applying common voltage. The common voltage of the partition 6 is applied to the upper electrodes UE1, UE2 and UE3.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

The cap layers CP1, CP2 and CP3 function as optical adjustment layers which improve the extraction efficiency of the light emitted from the organic layers OR1, OR2 and OR3, respectively. It should be noted that at least one of the cap layers CP1, CP2 and CP3 may be omitted.

Of the lower electrode LE1, the organic layer OR1, the upper electrode UE1 and the cap layer CP1, the portions which overlap the pixel aperture AP1 constitute the display element DE1 of subpixel SP1. Of the lower electrode LE2, the organic layer OR2, the upper electrode UE2 and the cap layer CP2, the portions which overlap the pixel aperture AP2 constitute the display element DE2 of subpixel SP2. Of the lower electrode LE3, the organic layer OR3, the upper electrode UE3 and the cap layer CP3, the portions which overlap the pixel aperture AP3 constitute the display element DE3 of subpixel SP3.

The thin film FL1 is partly located on the top portion 63. This portion is spaced apart from, of the thin film FL1, the portion located under the partition 6 (in other words, the portion which constitutes the display element DE1). Similarly, the thin film FL2 is partly located on the top portion 63. This portion is spaced apart from, of the thin film FL2, the portion located under the partition 6 (in other words, the portion which constitutes the display element DE2). Further, the thin film FL3 is partly located on the top portion 63. This portion is spaced apart from, of the thin film FL3, the portion located under the partition 6 (in other words, the portion which constitutes the display element DE3).

Sealing layers SE1, SE2 and SE3 are provided in subpixels SP1, SP2 and SP3, respectively. The sealing layer SE1 continuously covers the thin film FL1 and the partition 6 around subpixel SP1. The sealing layer SE2 continuously covers the thin film FL2 and the partition 6 around subpixel SP2. The sealing layer SE3 continuously covers the thin film FL3 and the partition 6 around subpixel SP3.

In the example of FIG. 3, the thin film FL1 and sealing layer SE1 located on the partition 6 between subpixels SP1 and SP2 are spaced apart from the thin film FL2 and sealing layer SE2 located on this partition 6. The thin film FL1 and sealing layer SE1 located on the partition 6 between subpixels SP1 and SP3 are spaced apart from the thin film FL3 and sealing layer SE3 located on this partition 6.

The sealing layers SE1, SE2 and SE3 are covered with a resin layer 13. The resin layer 13 is covered with a sealing layer 14. The sealing layer 14 is covered with a resin layer 15. The resin layers 13 and 15 and the sealing layer 14 are continuously provided in at least the entire display area DA and partly extend in the surrounding area SA as well.

A cover member such as a polarizer, a touch panel, a protective film or a cover glass may be further provided above the resin layer 15. This cover member may be attached to the resin layer 15 via, for example, an adhesive layer such as an optical clear adhesive (OCA).

The insulating layer 12 is formed of an organic insulating material. Each of the rib 5 and the sealing layers 14, SE1, SE2 and SE3 can be formed of an inorganic insulating material such as silicon nitride (SiN), silicon oxide (SiO), silicon oxynitride (SiON) or aluminum oxide ($Al_2O_3$). Each of the rib 5 and the sealing layers 14, SE1, SE2 and SE3 may comprise a single-layer structure formed of one of the inorganic insulating materials, or may comprise a stacked structure in which the layers of two or more types of inorganic insulating materials are stacked. The inorganic insulating materials of the rib 5 and the sealing layers 14, SE1, SE2 and SE3 may be the same as each other or different from each other.

Each of the resin layers 13 and 15 is formed of, for example, a resinous material (organic insulating material) such as epoxy resin or acrylic resin. Each of the lower electrodes LE1, LE2 and LE3 comprises a reflective layer formed of, for example, silver (Ag), and a pair of transparent conductive layers covering the upper and lower surfaces of the reflective layer. Each transparent conductive layer may be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a stacked structure consisting of a hole injection layer, a hole transport layer, an electron blocking layer, a light emitting layer, a hole blocking layer, an electron transport layer and an electron injection layer. Each of the organic layers OR1, OR2 and OR3 may comprise a tandem structure including a plurality of light emitting layers.

The cap layers CP1, CP2 and CP3 have refractive indices different from those of the upper electrodes UE1, UE2 and UE3 and the sealing layers SE1, SE2 and SE3. Each of the cap layers CP1, CP2 and CP3 may be formed of a multilayer body of a plurality of transparent thin films. As the thin films, the multilayer body may include a thin film formed of an inorganic material and a thin film formed of an organic material. These thin films have refractive indices different from each other. The materials of the thin films constituting the multilayer body are different from the materials of the upper electrodes UE1, UE2 and UE3 and are also different from the materials of the sealing layers SE1, SE2 and SE3.

Figure 4A:
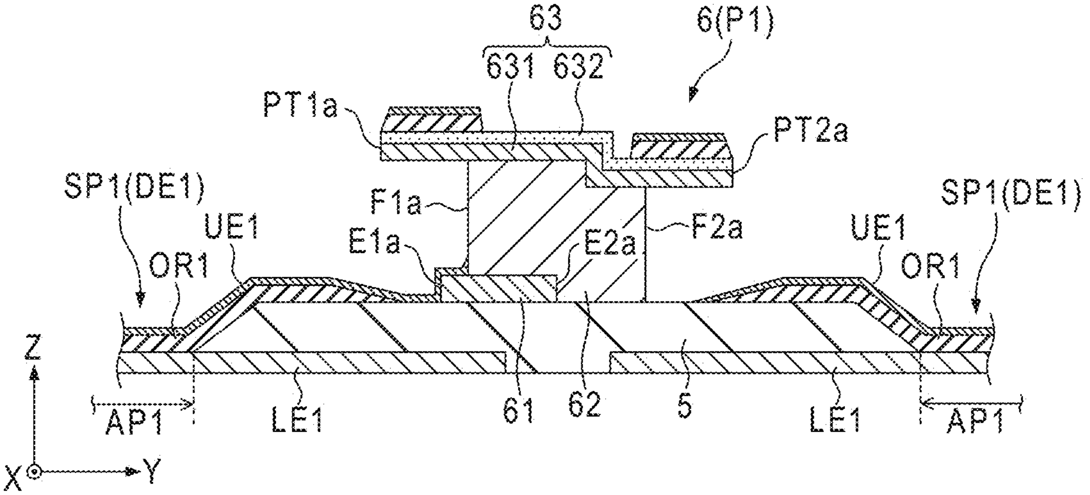
FIG. 4A is a schematic cross-sectional view of the first portion of a partition along the A-A line of FIG. 2.
Figure 4B:
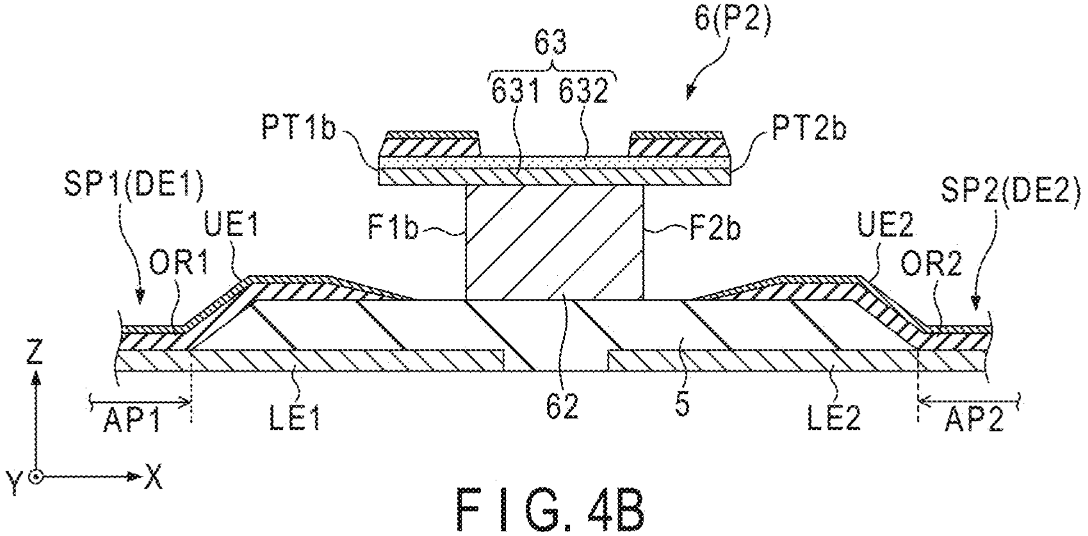
FIG. 4B is a schematic cross-sectional view of the second portion of the partition along the B-B line of FIG. 2.

FIG. 4A is a schematic cross-sectional view of the first portion P1 of the partition 6 along the A-A line of FIG. 2. FIG. 4B is a schematic cross-sectional view of the second portion P2 of the partition 6 along the B-B line of FIG. 2. In these figures, the elements other than the rib 5, the partition 6, the lower electrodes LE1 and LE2, the organic layers OR1 and OR2 and the upper electrodes UE1 and UE2 are omitted.

As shown in FIG. 4A, the first portion P1 includes the bottom portion 61, the stem portion 62 and the top portion 63. The bottom portion 61 is provided on the rib 5. The stem portion 62 is provided on the rib 5 and the bottom portion 61. In the examples of FIG. 4A and FIG. 4B, each of the bottom portion 61 and the stem portion 62 comprises a single-layer structure. To the contrary, the top portion 63 comprises a stacked structure consisting of a first top layer 631 and a second top layer 632 provided on the first top layer 631. For example, the bottom portion 61 and the top portion 63 are thinner than the stem portion 62. However, the configuration is not limited to this example.

It should be noted that the structures of the bottom portion 61, the stem portion 62 and the top potion 63 are not limited to the example of FIG. 4A or FIG. 4B. For example, each of the bottom portion 61 and the stem portion 62 may comprise a stacked structure in which a plurality of layers are stacked. The top portion 63 may comprise a single-layer structure.

The bottom portion 61 shown in FIG. 4A comprises a first end portion E1*a* on the left pixel aperture AP1 side, and a second end portion E2*a* located on a side opposite to the first end portion E1*a* in the second direction Y. The stem portion 62 of the first portion P1 comprises a first side surface F1*a* on the left pixel aperture AP1 side, and a second side surface F2*a* located on a side opposite to the first side surface F1*a* in the second direction Y. The top portion 63 of the first portion P1 comprises a first protrusion PT1*a* which protrudes from the first side surface F1*a*, and a second protrusion PT2*a* which protrudes from the second side surface F2*a*.

The first end portion E1*a* is exposed from the stem portion 62. To the contrary, the second end portion E2*a* is covered with the stem portion 62. In the area between the second end portion E2*a* and the second side surface F2*a*, the stem portion 62 is in contact with the upper surface of the rib 5. For example, the width of the bottom portion 61 is approximately half the width of the stem portion 62.

In the example of FIG. 4A, the first end portion E1*a* protrudes from the first side surface F1*a*. The protrusion length of the first end portion E1*a* from the first side surface F1*a* is less than that of the first protrusion PT1*a* from the first side surface F1*a*. Thus, the entire first end portion E1*a* is located under the first protrusion PT1*a* in a third direction Z.

As shown in FIG. 4B, the second portion P2 includes the stem portion 62 and the top portion 63 and does not include the bottom portion 61. The stem portion 62 of the second portion P2 comprises a first side surface F1*b* on the left pixel aperture AP1 side, and a second side surface F2*b* located on a side opposite to the first side surface F1*b* in the first direction X. The top portion 63 of the second portion P2 comprises a first protrusion PT1*b* which protrudes from the first side surface F1*b*, and a second protrusion PT2*b* which protrudes from the second side surface F2*b*.

The bottom portion 61 can be formed of, for example, a conductive material such as aluminum (Al), titanium (Ti), titanium nitride (TiN), molybdenum (Mo), tungsten (W), a molybdenum-tungsten alloy (MoW), a molybdenum-niobium alloy (MoNb), ITO or IZO. The bottom portion 61 may comprise a single-layer structure formed of one of these materials or may comprise a stacked structure including a plurality of layers formed of different materials.

The stem portion 62 may be formed of, for example, a conductive material such as aluminum, an aluminum-neodymium alloy (AlNd), an aluminum-yttrium alloy (AlY) or an aluminum-silicon alloy (AlSi). The stem portion 62 may comprise a single-layer structure formed of one of these materials or may comprise a stacked structure including a plurality of layers formed of different materials.

Each of the first top layer 631 and the second top layer 632 may be formed of, for example, an insulating material such as silicon nitride, silicon oxide or silicon oxynitride, or may be formed of a conductive material such as aluminum, titanium, titanium nitride, molybdenum, tungsten, a molybdenum-tungsten alloy, a molybdenum-niobium alloy, ITO or IZO. For example, the first top layer 631 is formed of titanium, and the second top layer 632 is formed of ITO. It should be noted that one of the first top layer 631 and the second top layer 632 may be formed of a conductive material, and the other one may be formed of an insulating material. Both the first top layer 631 and the second top layer 632 may be formed of an insulating material.

The end portion of each of the organic layers OR1 provided on the right and left sides in FIG. 4A is spaced apart from the first portion P1 and is covered with the upper electrode UE1. The upper electrode UE1 located on the left side of the figure is in contact with the first end portion E1*a* of the bottom portion 61. This upper electrode UE1 may be further in contact with the first side surface F1*a* located above the first end portion E1*a*. In the example of FIG. 4A, the upper electrode UE1 located on the right side of the figure is spaced apart from the second side surface F2*a*. It should be noted that this upper electrode UE1 may be in contact with the second side surface F2*a*.

The end portion of the organic layer OR1 shown in FIG. 4B is also covered with the upper electrode UE1. Further, the end portion of the organic layer OR2 is covered with the upper electrode UE2. In the example of FIG. 4B, the upper electrode UE1 is spaced apart from the first side surface F1*b*, and the upper electrode UE2 is spaced apart from the second side surface F2*b*. It should be noted that the upper electrode UE1 may be in contact with the first side surface F1*b*. Further, the upper electrode UE2 may be in contact with the second side surface F2*b*.

FIG. 4A shows the structure in which the upper electrode UE1 is in contact with the first portion P1. The upper electrodes UE2 and UE3 are also in contact with the bottom portion 61 of the first portion P1 in a similar manner. Thus, common voltage is applied to the upper electrodes UE1, UE2 and UE3 via at least the first portion P1.

Figure 5:
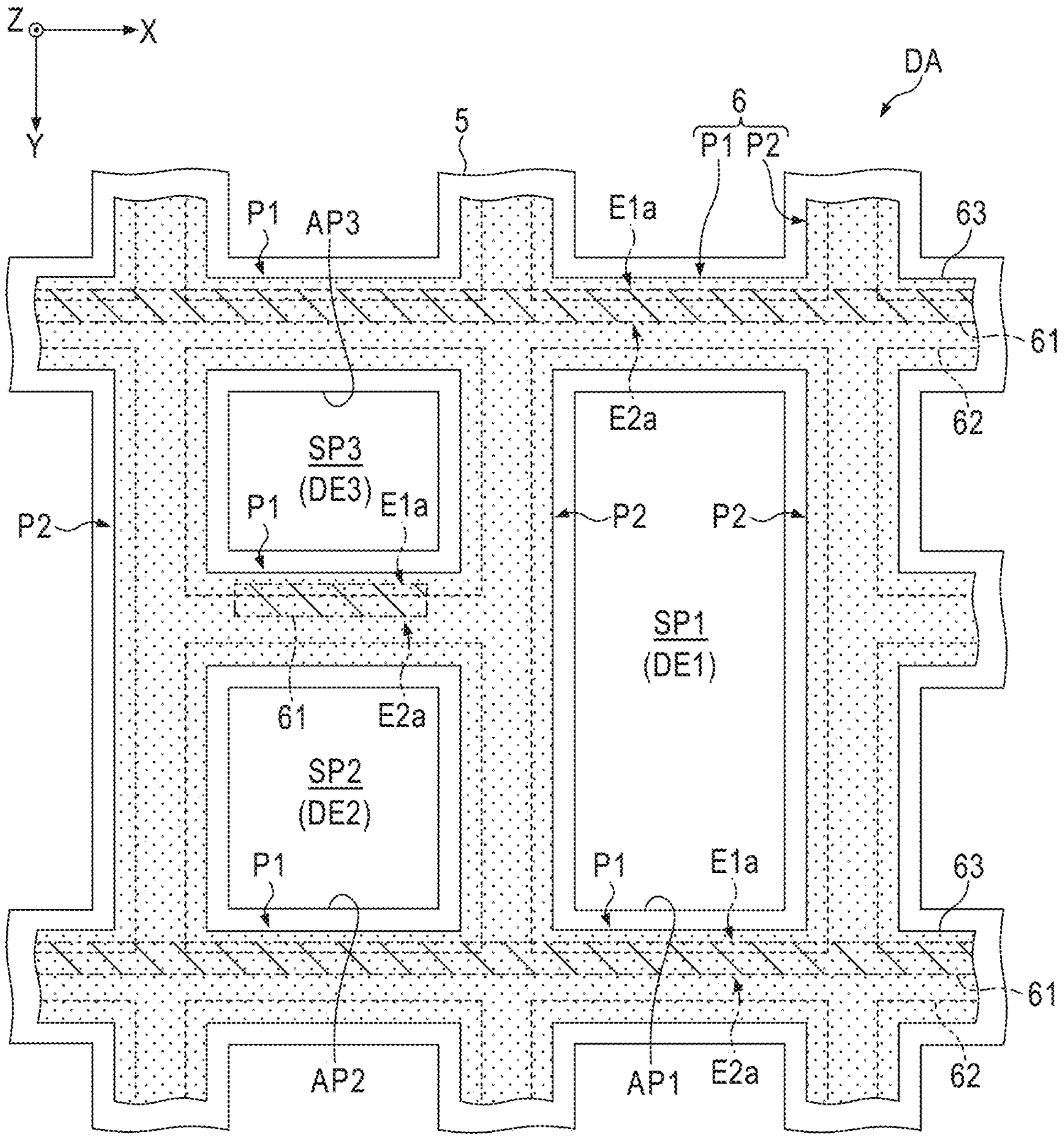
FIG. 5 is a schematic plan view showing another example of the layout of subpixels.

FIG. 5 is a schematic plan view showing another example of the layout of subpixels SP1, SP2 and SP3. In this example, the width of the pixel aperture AP1 in the second direction Y is greater than that of the pixel aperture AP2 in the second direction Y. Further, the width of the pixel aperture AP2 in the second direction Y is greater than that of the pixel aperture AP3 in the second direction Y. The widths of the pixel apertures AP1, AP2 and AP3 in the first direction Y are, for example, equal to each other. The pixel apertures AP2 and AP3 are arranged in the second direction Y. Further, the pixel aperture AP2 and the pixel aperture AP1 are arranged in the first direction X. The pixel aperture AP3 and the pixel aperture AP1 are arranged in the first direction X.

In a manner similar to that of the example of FIG. 2, the partition 6 comprises a plurality of first portions P1 extending in the first direction X and a plurality of second portions P2 extending in the second direction Y. Each of the pixel apertures AP1, AP2 and AP3 is surrounded by two second portions P2 which are adjacent to each other in the first direction X and two first portions P1 which are adjacent to each other in the second direction Y.

In the first portions P1 located on the upper side of the pixel apertures AP1 and AP3 in the figure, the bottom portion 61 continuously extends in the first direction X over these first portions P1. Similarly, in the first portions P1 located on the lower side of the pixel apertures AP1 and AP2 in the figure, the bottom portion 61 continuously extends in the first direction X over these first portions P1. To the contrary, in the first portion P1 located between the pixel apertures AP2 and AP3, an island shaped bottom portion 61 which is not continuous with the other bottom portions 61 is provided. This island shaped bottom portion 61 is electrically connected to the other bottom portions 61 via the conductive stem portion 62.

The upper electrodes UE1 and UE2 of the display elements DE1 and DE2 are in contact with the first end portion E1*a* of the bottom portion 61 located on the lower side of the figure. The upper electrode UE3 of the display element DE3 is in contact with the first end portion E1*a* of the bottom portion 61 located between the pixel apertures AP2 and AP3.

Now, this specification explains the manufacturing method of the display device DSP with reference to an example in which subpixels SP1, SP2 and SP3 are provided in line with the layout shown in FIG. 5.

Figure 6:
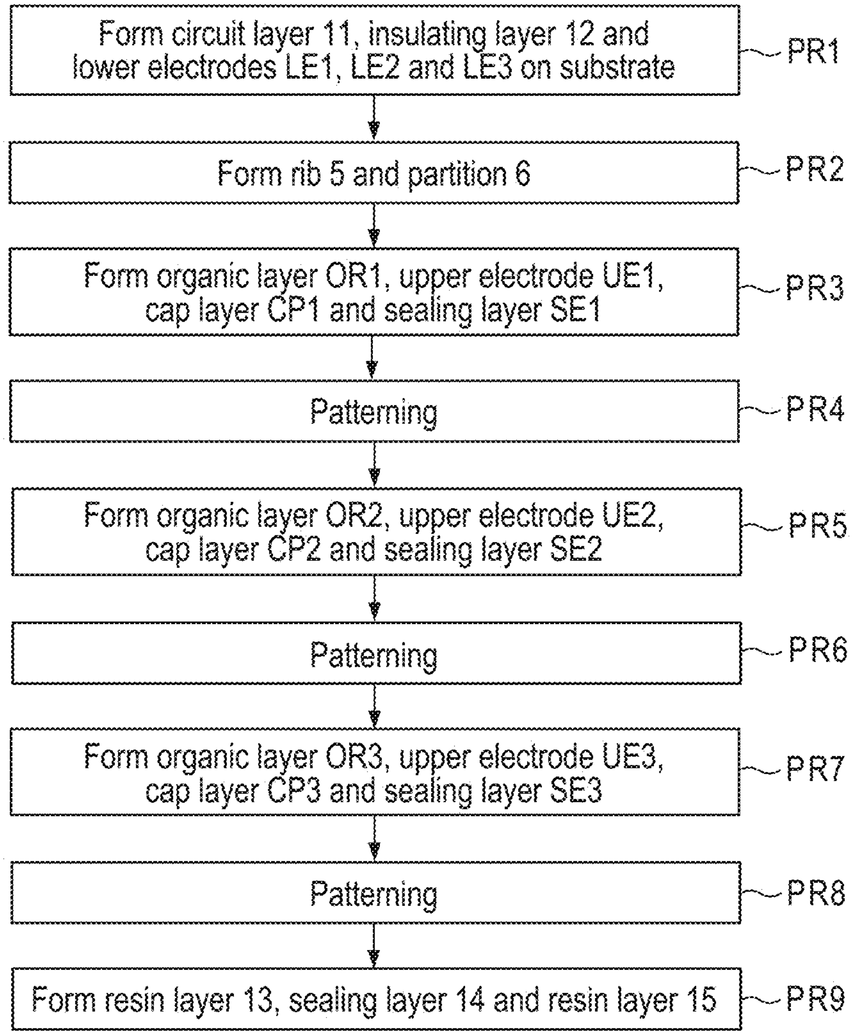
FIG. 6 is a flowchart showing an example of the manufacturing method of the display device according to the first embodiment.

FIG. 6 is a flowchart showing an example of the manufacturing method of the display device DSP. To manufacture the display device DSP, first, the circuit layer 11, the insulating layer 12 and the lower electrodes LE1, LE2 and LE3 are formed on the substrate 10 (process PR1). Further, the rib 5 and the partition 6 are formed (process PR2).

FIG. 7 to FIG. 12 are diagrams showing a series of processes for forming the rib 5 and the partition 6. In these drawings, (a) shows a schematic plan view of part of the display area DA, and (b) shows a schematic cross-sectional view of the area in which the first portion P1 is formed, and (c) shows a schematic cross-sectional view of the area in which the second portion P2 is formed.

Figure 7:
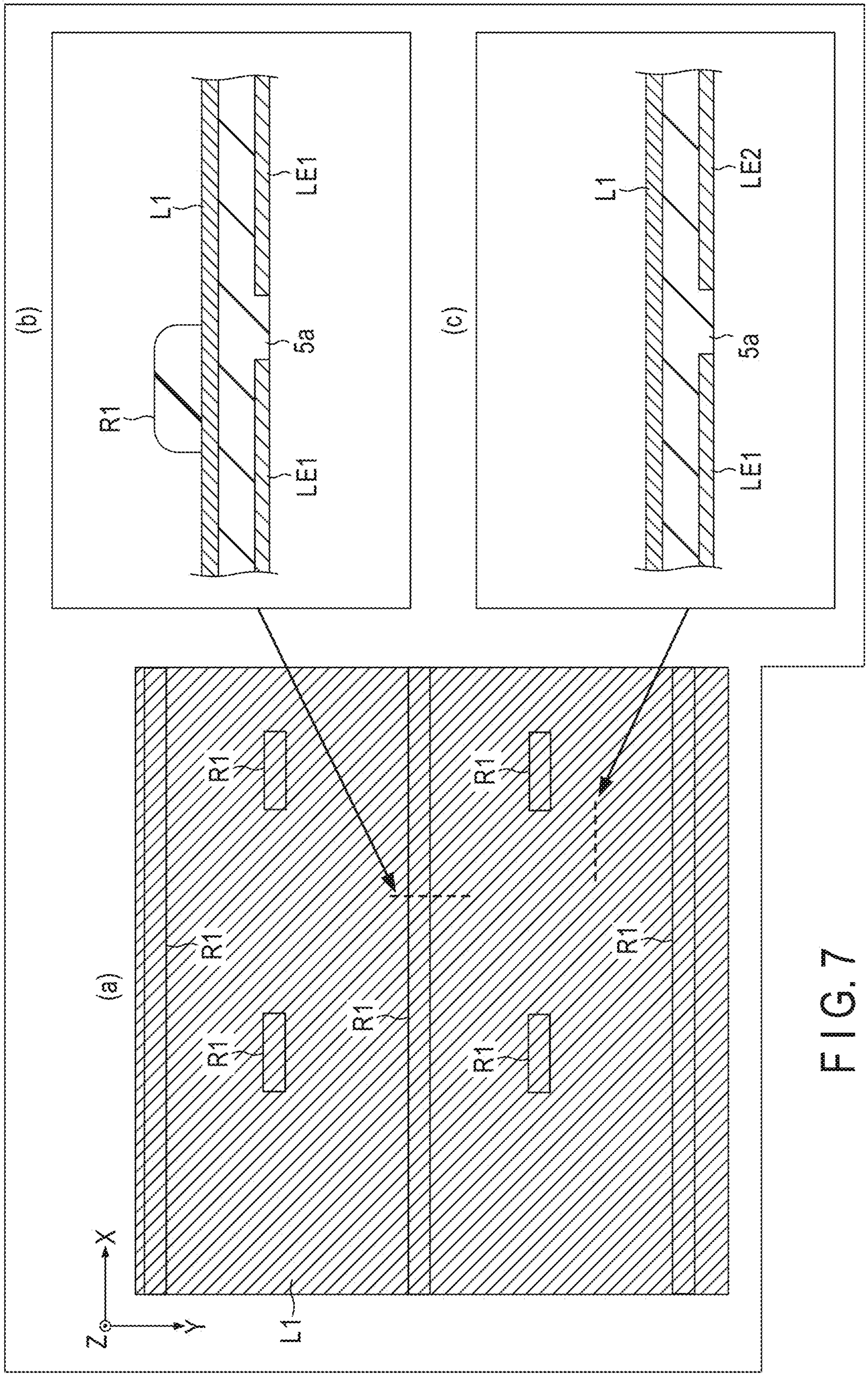
FIG. 7 is a diagram showing the process of forming a rib and the partition.
Figure 8:
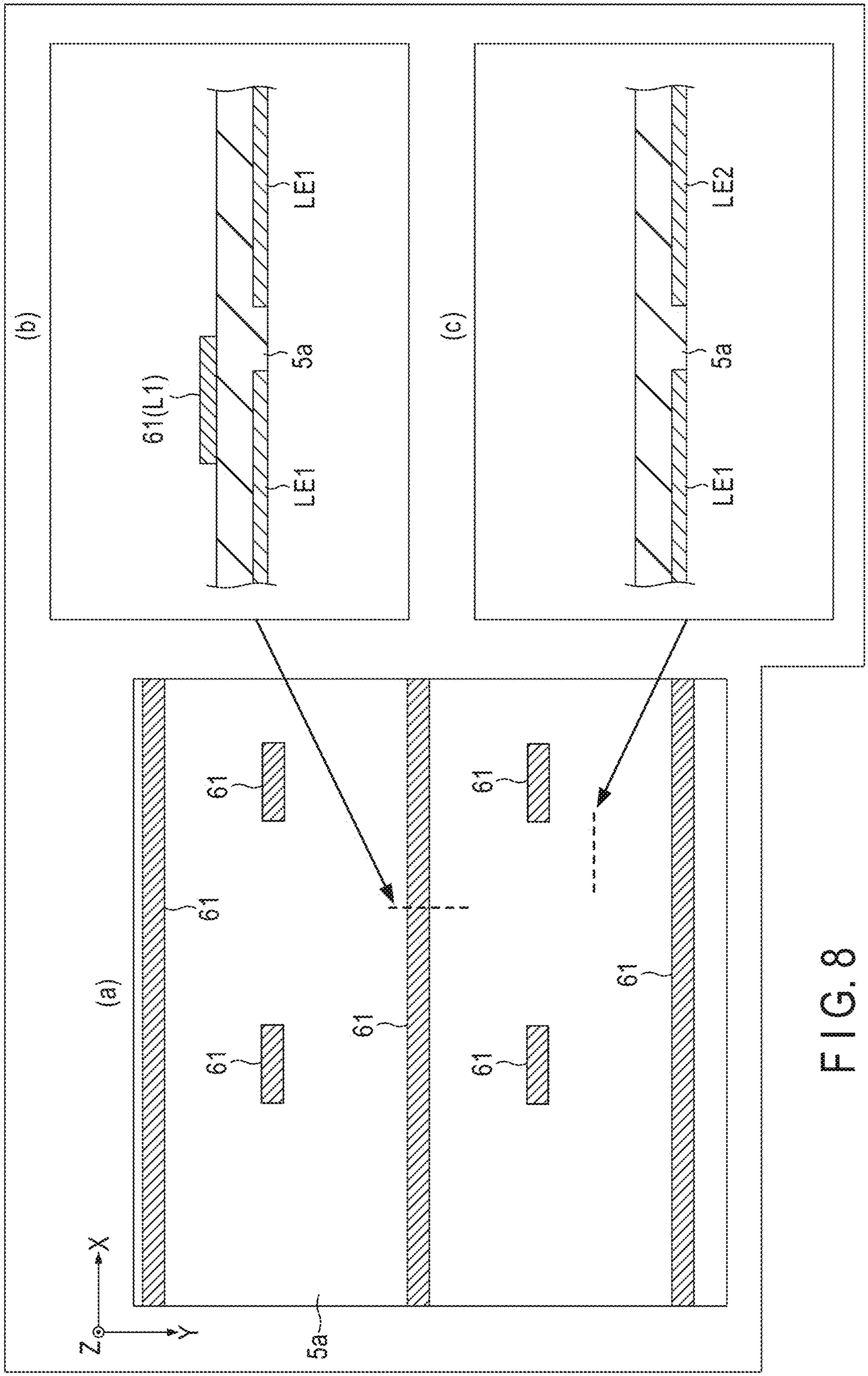
FIG. 8 is a diagram showing a process following FIG. 7.

In process PR2, first, as shown in FIG. 7, an insulating layer 5*a* which is processed so as to be the rib 5 is formed. A first layer L1 which is processed so as to be the bottom portion 61 is formed on the insulating layer 5*a*. Further, a resist R1 is formed on the first layer L1. In FIG. 7(*a*), a diagonal pattern is added to the area in which the first layer L1 is formed (at this stage, the entire display area DA). The resist R1 has a planar shape similar to that of the bottom portion 61 shown in FIG. 5. The first layer L1 is patterned by etching using the resist R1 as a mask. After this patterning, the resist R1 is removed. By this process, as shown in FIG. 8, the bottom portions 61 are formed.

Figure 9:
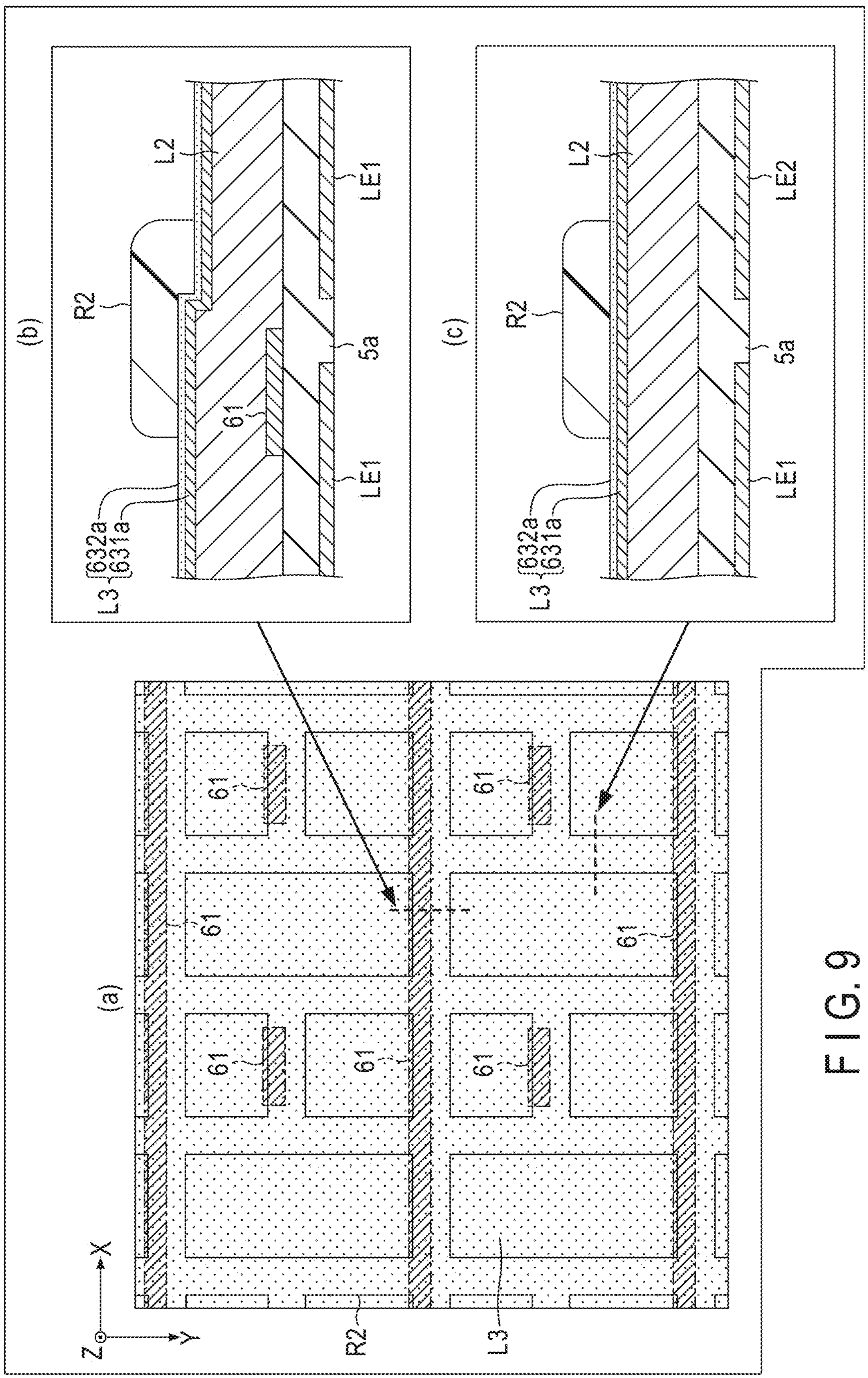
FIG. 9 is a diagram showing a process following FIG. 8.

Subsequently, as shown in FIG. 9, a second layer L2 which is processed so as to be the stem portion 62 is formed on the insulating layer 5*a* and the bottom portion 61. A third layer L3 which is processed so as to be the top portion 63 is formed on the second layer L2. A resist R2 patterned into the planar shape of the partition 6 is formed on the third layer L3. As shown in FIG. 9(*b*) and FIG. 9(*c*), the third layer L3 includes a first top layer 631*a*, and a second top layer 632*a* which covers the first top layer 631*a*. In FIG. 9(*a*), a dotted pattern is added to the area in which the third layer L3 is present (at this stage, the entire display area DA).

Figure 10:
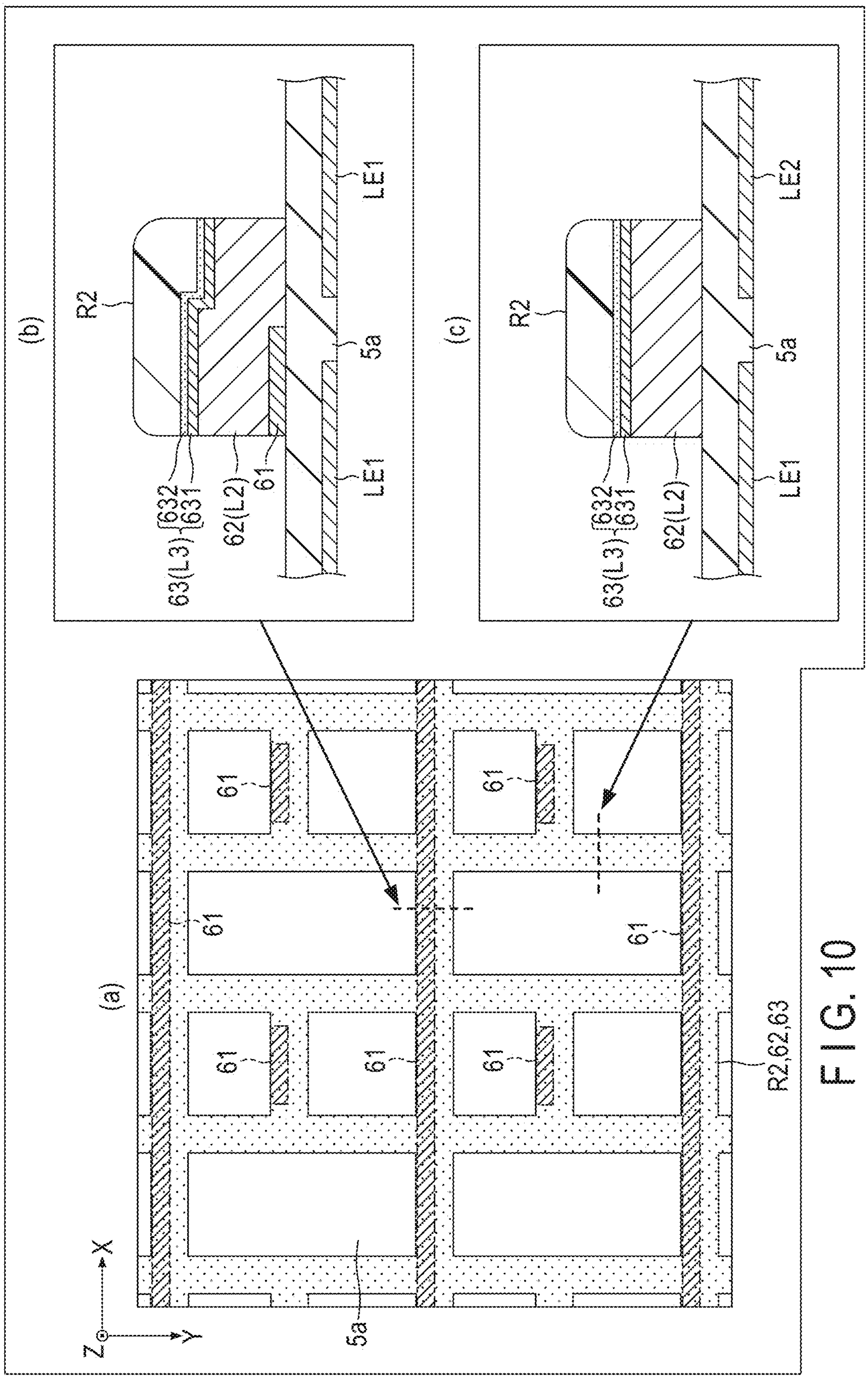
FIG. 10 is a diagram showing a process following FIG. 9.

After the process of FIG. 9, as shown in FIG. 10, the second layer L2 and the third layer L3 are patterned. This patterning includes etching for removing the portion of the second top layer 632*a* exposed from the resist R2 and etching for removing the portion of the first top layer 631*a* exposed from the resist R2. By these etching processes, the top portion 63 including the first top layer 631 and the second top layer 632 is formed.

Further, this patterning includes anisotropic dry etching for removing the portion of the second layer L2 exposed from the resist R2. By this process, the stem portion 62 having substantially the same width as the top portion 63 is formed.

It should be noted that the bottom portion 61 shown in FIG. 9 partly protrudes from the resist R2. The patterning of FIG. 10 further includes anisotropic etching for removing this protruding portion.

Figure 11:
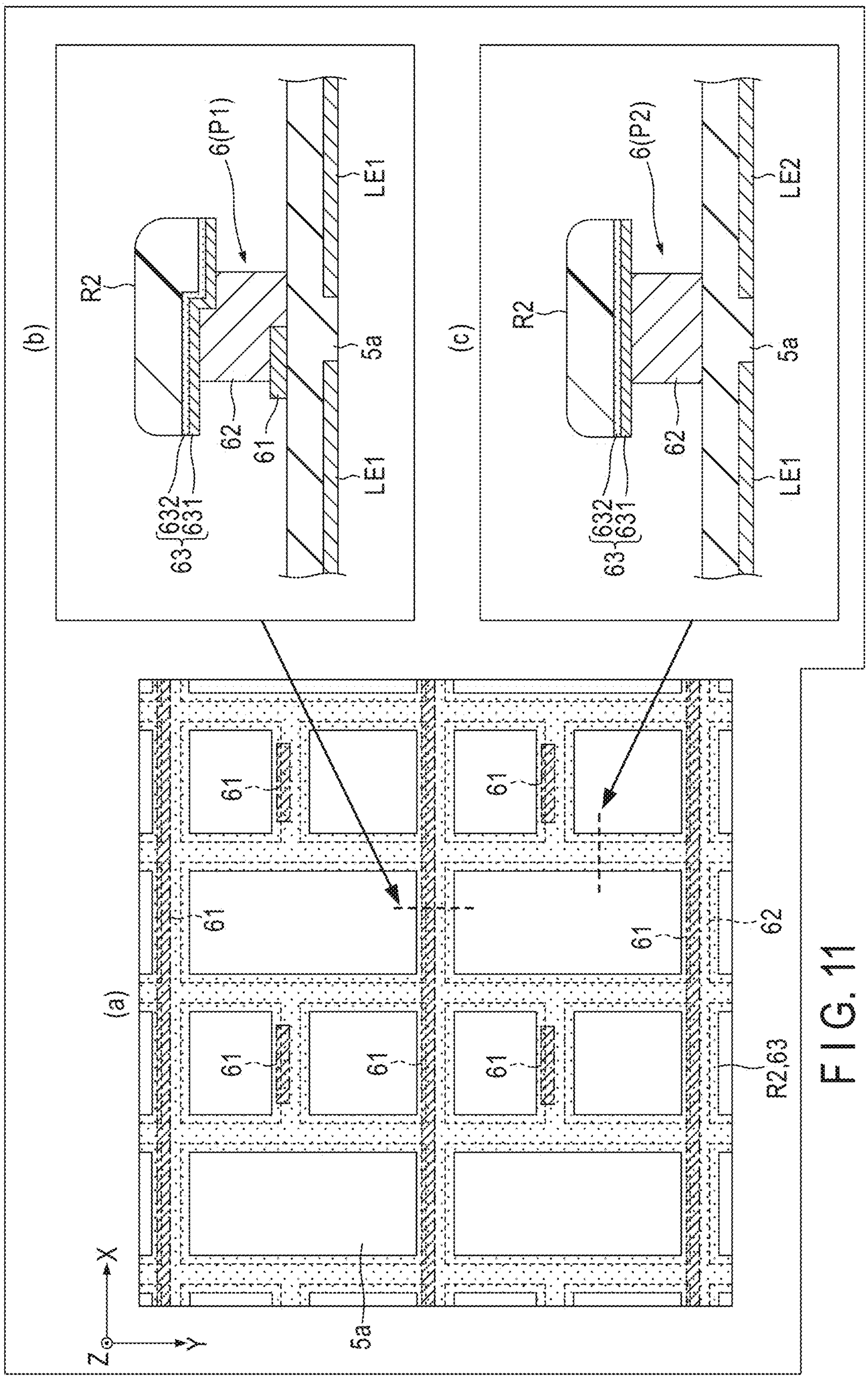
FIG. 11 is a diagram showing a process following FIG. 10.

Subsequently, as shown in FIG. 11, isotropic wet etching for reducing the width of the stem portion 62 is performed. Further, dry etching for slightly retracting the bottom portion 61 which protrudes from the stem portion 62 is performed. After these etching processes, the resist R2 is removed.

Figure 12:
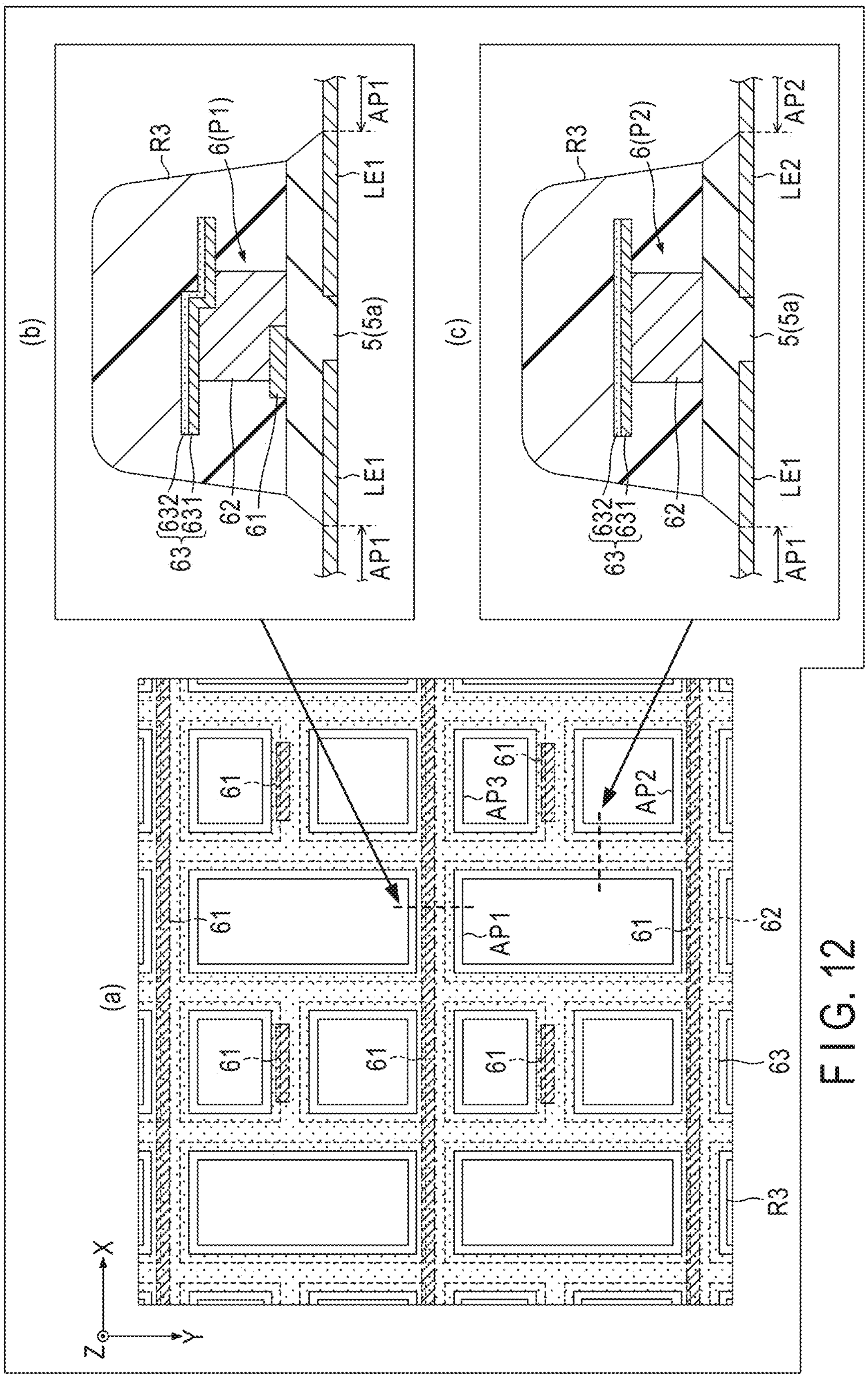
FIG. 12 is a diagram showing a process following FIG. 11.

After the process of FIG. 11, as shown in FIG. 12, a resist R3 patterned into the planar shape of the rib 5 is provided. Moreover, the portion of the insulating layer 5*a* exposed from the resist R3 is removed by etching. By this process, the rib 5 comprising the pixel apertures AP1, AP2 and AP3 is formed. After this etching, the resist R3 is removed.

In the example of FIG. 7 to FIG. 12, the pixel apertures AP1, AP2 and AP3 of the rib 5 are formed after the formation of the partition 6. As another example, the partition 6 may be formed after the formation of the pixel apertures AP1, AP2 and AP3.

After the formation of the rib 5 and the partition 6, processes PR3 to PR8 for forming the display elements DE1, DE2 and DE3 are performed (see FIG. 6). In the present embodiment, this specification assumes a case where the display element DE1 is formed firstly, and the display element DE2 is formed secondly, and the display element DE3 is formed lastly. It should be noted that the formation order of the display elements DE1, DE2 and DE3 is not limited to this example.

Regarding the formation of the display element DE1, the organic layer OR1, the upper electrode UE1 and the cap layer CP1 are formed in the entire display area DA in order by vapor deposition, and further, the sealing layer SE is formed by CVD (process PR3). The thin film FL1 including the organic layer OR1, the upper electrode UE1 and the cap layer CP1 is divided by the partition 6 having an overhang shape. The sealing layer SE1 continuously covers the thin film FL1 and the partition 6 without being divided by the partition 6.

After process PR3, the thin film FL1 and the sealing layer SE1 are patterned (process PR4). In this patterning, of the thin film FL1 and the sealing layer SE1, the portions located in subpixel SP1 remain, and the other portions are removed. By this process, the display element DE1 is formed.

After process PR4, the organic layer OR2, the upper electrode UE2 and the cap layer CP2 are formed in the entire display area DA in order by vapor deposition, and further, the sealing layer SE2 is formed by CVD (process PR5). The thin film FL2 including the organic layer OR2, the upper electrode UE2 and the cap layer CP2 is divided by the partition 6 having an overhang shape. The sealing layer SE2 continuously covers the thin film FL2 and the partition 6 without being divided by the partition 6.

After process PR5, the thin film FL2 and the sealing layer SE2 are patterned (process PR6). In this patterning, of the stacked film FL2 and the sealing layer SE2, the portions located in subpixel SP2 remain, and the other portions are removed. By this process, the display element DE2 is formed.

After process PR6, the organic layer OR3, the upper electrode UE3 and the cap layer CP3 are formed in the entire display area DA in order by vapor deposition, and further, the sealing layer SE3 is formed by CVD (process PR7). The thin film FL3 including the organic layer OR3, the upper electrode UE3 and the cap layer CP3 is divided by the partition 6 having an overhang shape. The sealing layer SE3 continuously covers the thin film FL3 and the partition 6 without being divided by the partition 6.

After process PR7, the thin film FL3 and the sealing layer SE3 are patterned (process PR8). In this patterning, of the thin film FL3 and the sealing layer SE3, the portions located in subpixel SP3 remain, and the other portions are removed. By this process, the display element DE3 is formed.

After the display elements DE1, DE2 and DE3 and the sealing layers SE1, SE2 and SE3 are formed, the resin layer 13, sealing layer 14 and resin layer 15 shown in FIG. 3 are formed in order (process PR9). By this process, the display device DSP is completed.

Now, this specification explains the process of depositing the organic layer OR1 and the upper electrode UE1 with reference to FIG. 13A to FIG. 14B.

Figure 13A:
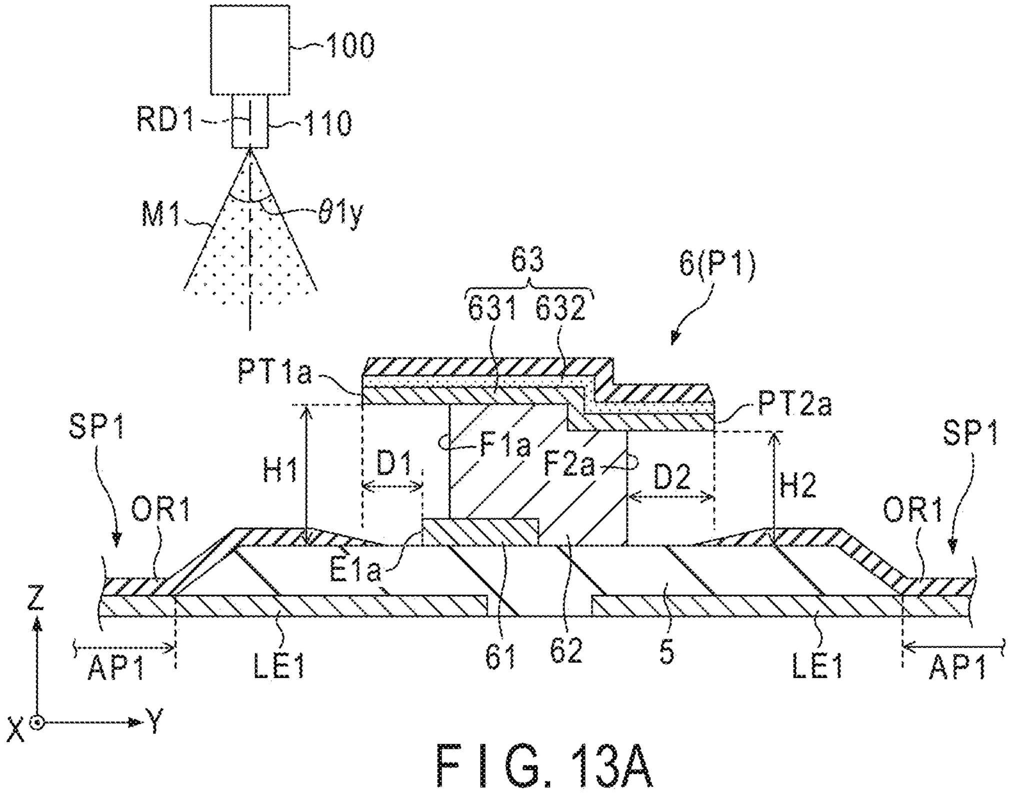
FIG. 13A is a schematic cross-sectional view showing the process of depositing an organic layer.
Figure 13B:
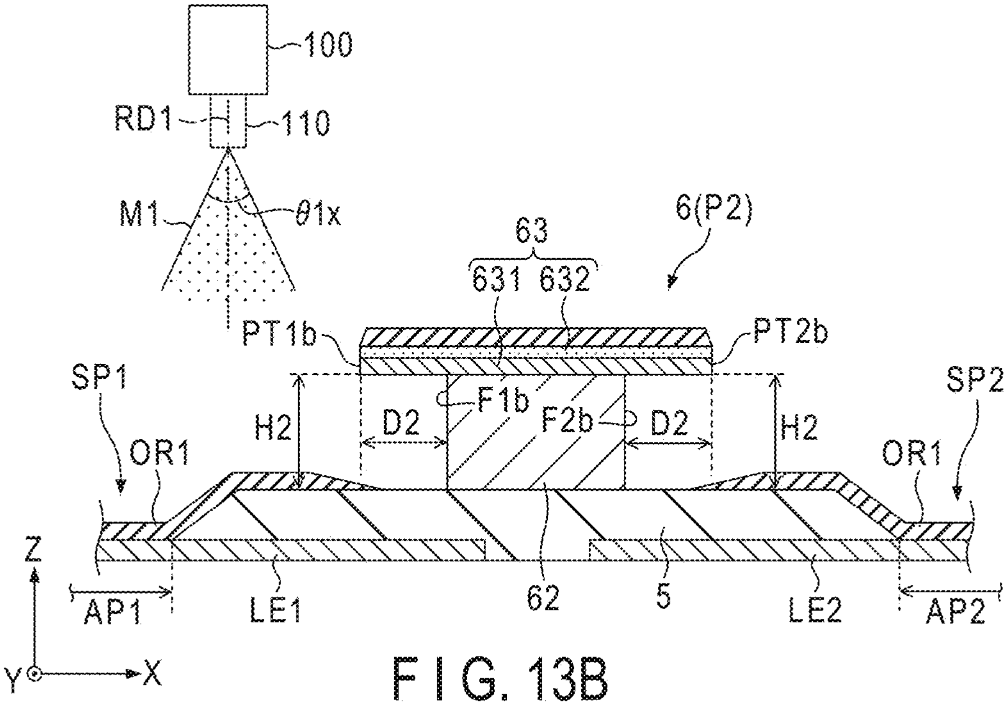
FIG. 13B is another schematic cross-sectional view showing the process of depositing the organic layer.
Figure 14A:
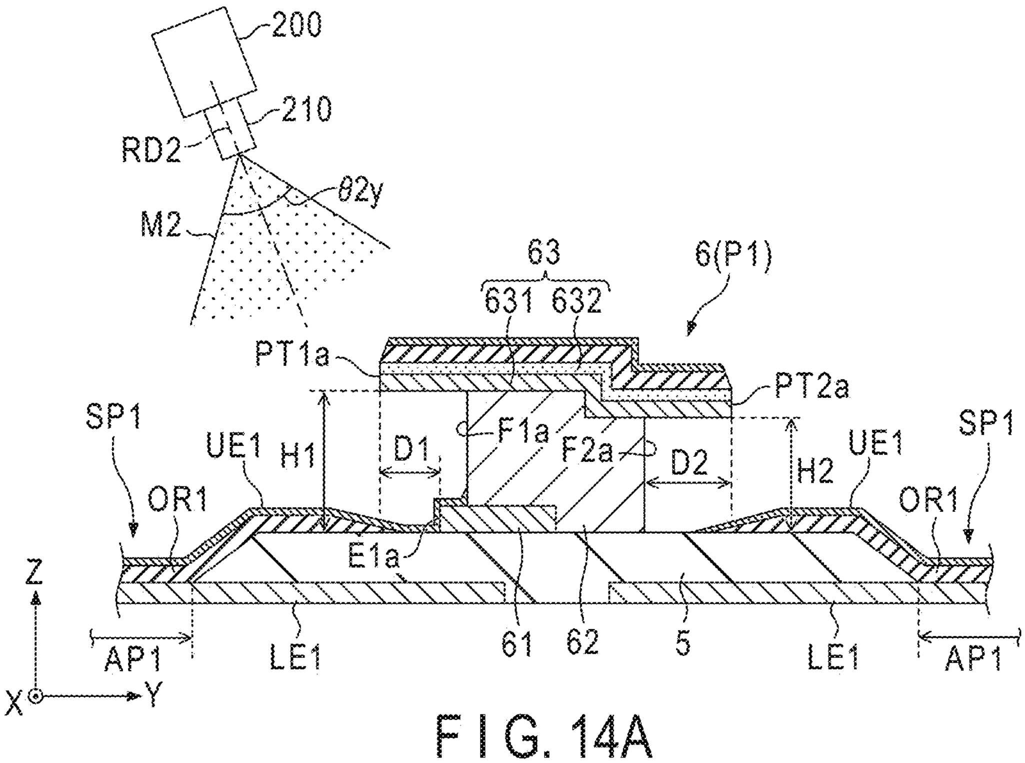
FIG. 14A is a schematic cross-sectional view showing the process of depositing an upper electrode.
Figure 14B:
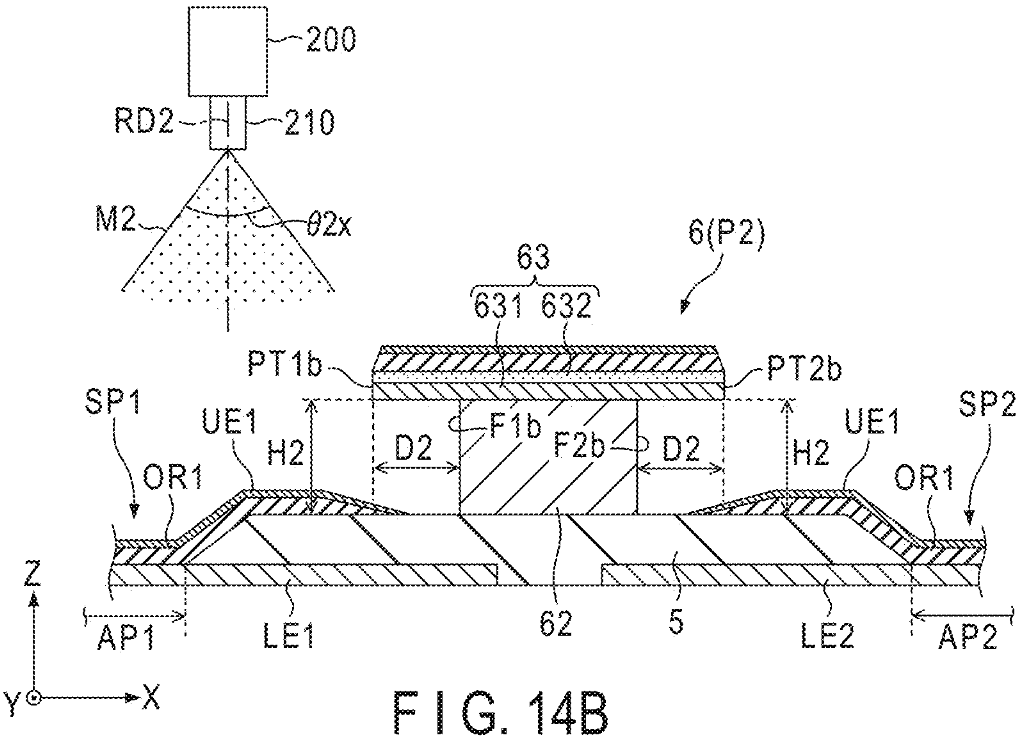
FIG. 14B is another schematic cross-sectional view showing the process of depositing the upper electrode.

FIG. 13A and FIG. 13B are schematic cross-sectional views showing the process of depositing the organic layer OR1. FIG. 14A and FIG. 14B are schematic cross-sectional views showing the process of depositing the upper electrode UE1. The cross-sectional views of FIG. 13A and FIG. 14A include the first portion P1 of the partition 6 in a manner similar to that of FIG. 4A. The cross-sectional views of FIG. 13B and FIG. 14B include the second portion P2 of the partition 6 in a manner similar to that of FIG. 4B.

To form the organic layer OR1, a substrate (mother substrate) in which the rib 5 and the partition 6 are formed is conveyed to the chambers for forming the layers constituting the organic layer OR1 in series. In each chamber, the evaporation source 100 shown in FIG. 13A and FIG. 13B is provided. Evaporation material M1 is emitted from the nozzle 110 of the evaporation source 100.

Evaporation material M1 is emitted from the nozzle 110 while spreading. Emission direction RD1 of evaporation material M1 is parallel to the third direction Z in both of the sections of FIG. 13A and FIG. 13B.

As shown in FIG. 13A, evaporation material M1 emitted from the nozzle 110 has spread angle $\theta 1y$ in the Y-Z section defined by the second direction Y and the third direction Z. As shown in FIG. 13B, evaporation material M1 has spread angle $\theta 1x$ in the X-Z section defined by the first direction X and the third direction Z. Both spread angle $\theta 1y$ and spread angle $\theta 1x$ are angles at which evaporation material M1 is blocked by the top portion 63 and is not attached to the bottom portion 61 or the stem portion 62.

The substrate in which the organic layer OR1 is formed is conveyed to the chamber for forming the upper electrode UE1. In this chamber, the evaporation source 200 shown in FIG. 14A and FIG. 14B is provided. Evaporation material M2 is emitted from the nozzle 210 of the evaporation source 200.

Evaporation material M2 is emitted from the nozzle 210 while spreading. In the section of FIG. 14A, emission direction RD2 of evaporation material M2 inclines with respect to the third direction Z such that the evaporation material is easily attached to the bottom portion 61. In the section of FIG. 14B, emission direction RD2 is parallel to the third direction Z.

As shown in FIG. 14A, evaporation material M2 emitted from the nozzle 210 has spread angle $\theta 2y$ in the Y-Z section. As shown in FIG. 14B, evaporation material M2 has spread angle $\theta 2x$ in the X-Z section. Spread angle $\theta 2y$ is greater than spread angle $\theta 1y$ shown in FIG. 13A. Spread angle $\theta 2x$ is greater than spread angle $\theta 1x$ shown in FIG. 13B.

In the example of FIG. 14A, as emission direction RD2 inclines, the upper electrode UE1 which is satisfactorily in contact with the partition 6 is formed in subpixel SP1 on the left side of the figure. To the contrary, the upper electrode UE1 which is spaced apart from the partition 6 is formed in subpixel SP1 on the right side of the figure.

In the embodiment, the first end portion E1a of the bottom portion 61 protrudes from the first side surface F1a of the stem portion 62. In this case, protrusion length D1 of the first protrusion PT1a from the first end portion E1a is less than protrusion length D2 of the second protrusion PT2a from the second side surface F2a. Height H1 of the first protrusion PT1a from the upper surface of the rib 5 is greater than height H2 of the second protrusion PT2a from the upper surface of the rib 5 by the thickness of the bottom portion 61. In this configuration, the upper electrode UE1 which satisfactorily covers the vicinity of the first end portion E1a of the bottom portion 61 can be easily formed. To the contrary, near the second side surface F2a, as evaporation material M2 is blocked by the second protrusion PT2a, the upper electrode UE1 does not easily make contact with the second side surface F2a.

In the section of FIG. 14B, both the protrusion length of the first protrusion PT1b from the first side surface F1b and the protrusion length of the second protrusion PT2b from the second side surface F2b are D2. Both of the heights of protrusions PT1b and PT2b from the upper surface of the rib 5 are H2. In addition, emission direction RD2 of evaporation material M2 does not incline with respect to the third direction Z. In this case, evaporation material M2 does not easily go into the lower side of the protrusion PT1b or PT2b. Thus, the upper electrodes UE1 and UE2 which are spaced apart from the stem portion 62 are formed.

If the organic layer OR1 is in contact with the bottom portion 61 or the stem portion 62, leak current flows in the organic layer OR1, and a display failure could occur. Regarding evaporation material M1 of the organic layer OR1, emission direction RD1 does not incline, and further, spread angles $\theta 1y$ and 01$x$ are less. Therefore, evaporation material M1 is not easily attached to the bottom portion 61 or the stem portion 62. This configuration can prevent the contact between the organic layer OR1 and the bottom portion 61 or the stem portion 62.

It may be difficult to accurately control both spread angle $\theta 1y$ and spread angle $\theta 1x$ depending on the evaporation device. If one of spread angles $\theta 1y$ and $\theta 1x$ is great, there is a possibility that the organic layer OR1 is in contact with the bottom portion 61 and the stem portion 62. In this respect, in the configuration of FIG. 13A and FIG. 13B, when the contact with the bottom portion 61 is prevented by controlling at least spread angle $\theta 1y$ so as to be less, even if spread angle $\theta 1x$ is great to a certain extent, the contact between the organic layer OR1 and the stem portion 62 is easily prevented.

The processes of depositing the organic layers OR2 and OR3 and the upper electrodes UE2 and UE3 are similar to those shown in FIG. 13A to FIG. 14B. This configuration can also prevent the contact between the organic layers OR2 and OR3 and the bottom portion 61 or the stem portion 62. In addition, the upper electrodes UE2 and UE3 can satisfactorily make contact with the bottom portion 61.

As described above, in the embodiment, the bottom portions 61 are locally provided at positions where the upper electrodes UE1, UE2 and UE3 should be in contact with the partition 6 (in other words, the contact sides of the partition 6). This configuration allows the acquisition of a feeding structure in which both satisfactory feeding to the upper electrodes UE1, UE2 and UE3 and prevention of leak current in the organic layers OR1, OR2 and OR3 are achieved.

The configuration disclosed in the embodiment can be modified in various ways. Hereinafter, this specification shows modified examples of the first embodiment.

First Modified Example

Figure 15:
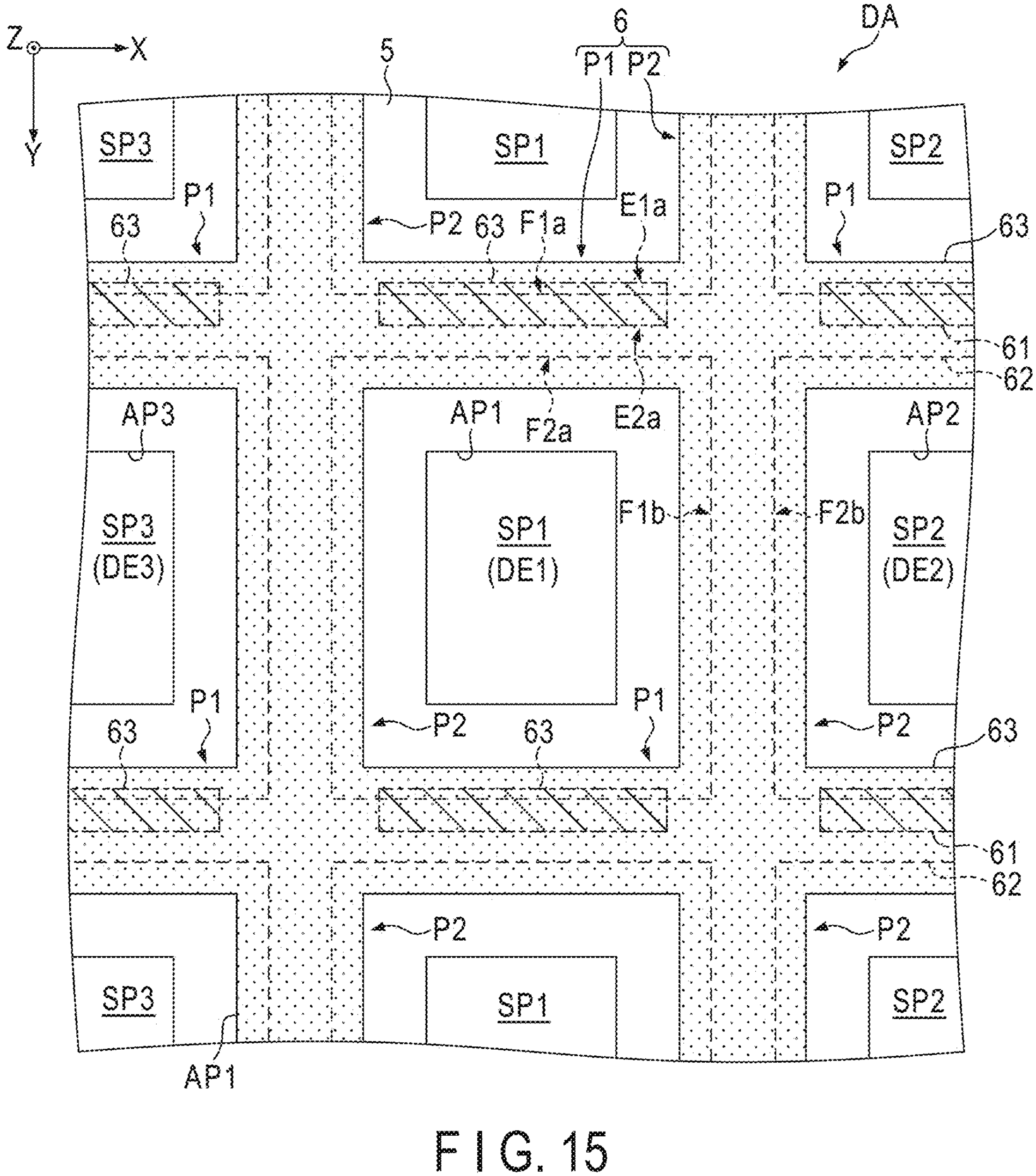
FIG. 15 is a plan view showing a first modified example.

FIG. 15 is a plan view showing a first modified example. This plan view shows a schematic configuration of the display area DA in a manner similar to that of FIG. 2. In the example of FIG. 2, each bottom portion 61 continuously extends in the first direction X along a plurality of subpixels SP1, SP2 and SP3. In the example of FIG. 15, an island shaped bottom portion 61 is provided for each of subpixels SP1, SP2 and SP3. Each bottom portion 61 has a shape which is elongated in the first direction X. These bottom portions 61 are electrically connected to each other via the conductive stem portion 62.

Second Modified Example

Figure 16:
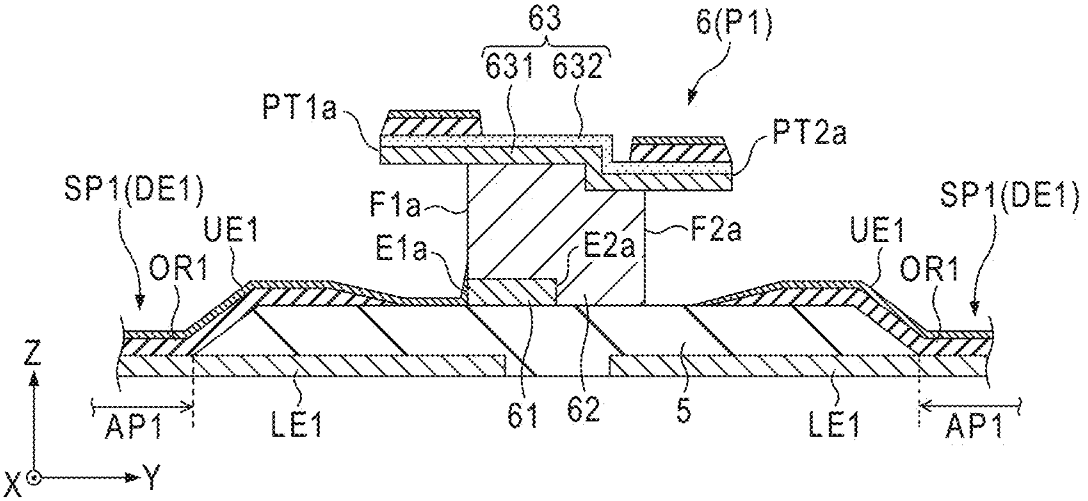
FIG. 16 is a cross-sectional view showing a second modified example.

FIG. 16 is a cross-sectional view showing a second modified example. This cross-sectional view shows a schematic configuration of the first portion P1 of the partition 6 in a manner similar to that of FIG. 4A. In the example of FIG. 16, the first end portion E1*a* of the bottom portion 61 does not protrude from the first side surface F1*a* of the stem portion 62. Thus, the first end portion E1*a* is aligned with the first side surface F1*a* in the third direction Z.

Third Modified Example

In the first embodiment, a case where the stem portion 62 is formed of a conductive material is assumed. However, the stem portion 62 may be formed of an insulating material. For the insulating material, for example, silicon nitride, silicon oxide or silicon oxynitride is considered. This modified example can be applied to either a case where the partition 6 comprises the first portion P1 shown in FIG. 4A or a case where the partition 6 comprises the first portion P1 shown in FIG. 16.

When the stem portion 62 is formed of an insulating material, for example, a configuration in which each bottom portion 61 continuously extends and crosses the display area DA as shown in FIG. 2 may be adopted, and each bottom portion 61 may be connected to the feeding source of common voltage in the surrounding area SA.

When the stem portion 62 is insulated, the generation of leak current to the organic layers OR1, OR2 and OR3 can be assuredly prevented on the second side surface F2*a* side in the first portion P1 and the second portion P2 which does not comprise the bottom portion 61.

Fourth Modified Example

In the examples of FIG. 2 and FIG. 5, each first portion P1 extends in the first direction X, and each second portion P2 extends in the second direction Y. However, in the layouts of subpixels SP1, SP2 and SP3 of FIG. 2 and FIG. 5, each first portion P1 may extend in the second direction Y, and each second portion P2 may extend in the first direction X.

Second Embodiment

A second embodiment is explained. Configurations or effects which are not particularly referred to are the same as those of the first embodiment.

Figure 17:
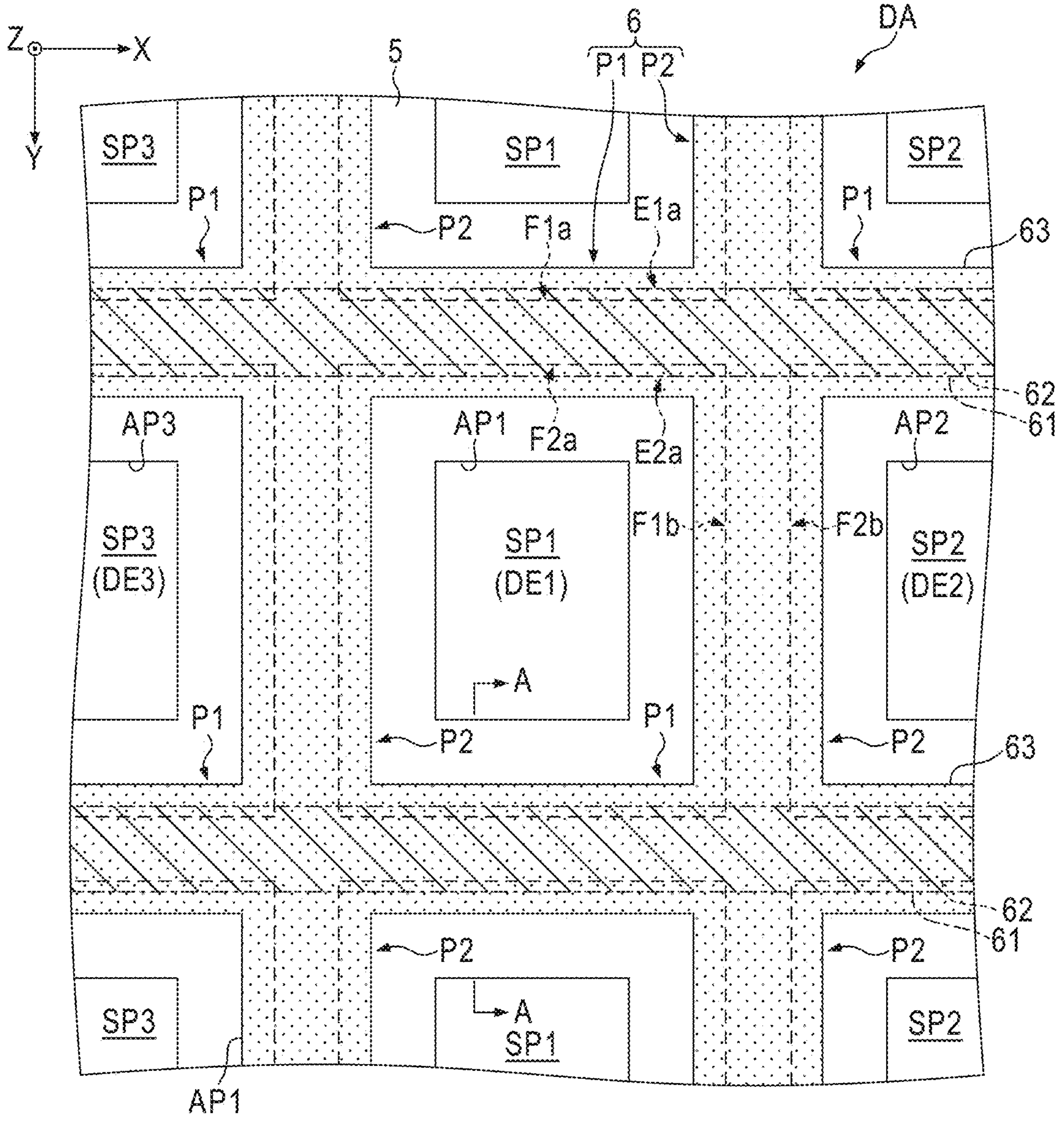
FIG. 17 is a schematic plan view of the display area of a display device according to a second embodiment.

FIG. 17 is a schematic plan view of the display area DA of a display device DSP according to the second embodiment. In a manner similar to that of the first embodiment, the partition 6 of the second embodiment comprises a first portion P1 including a bottom portion 61 and a second portion P2 which does not include the bottom portion 61. However, in this embodiment, the width of the bottom portion 61 in a second direction Y is greater than or equal to that of a stem portion 62 in the second direction Y.

In the example of FIG. 17, the bottom portion 61 continuously extends in a first direction X along a plurality of subpixels SP1, SP2 and SP3. As another example, in a manner similar to that of the example of FIG. 15, an island shaped bottom portion 61 may be provided for each of subpixels SP1, SP2 and SP3.

Figure 18:
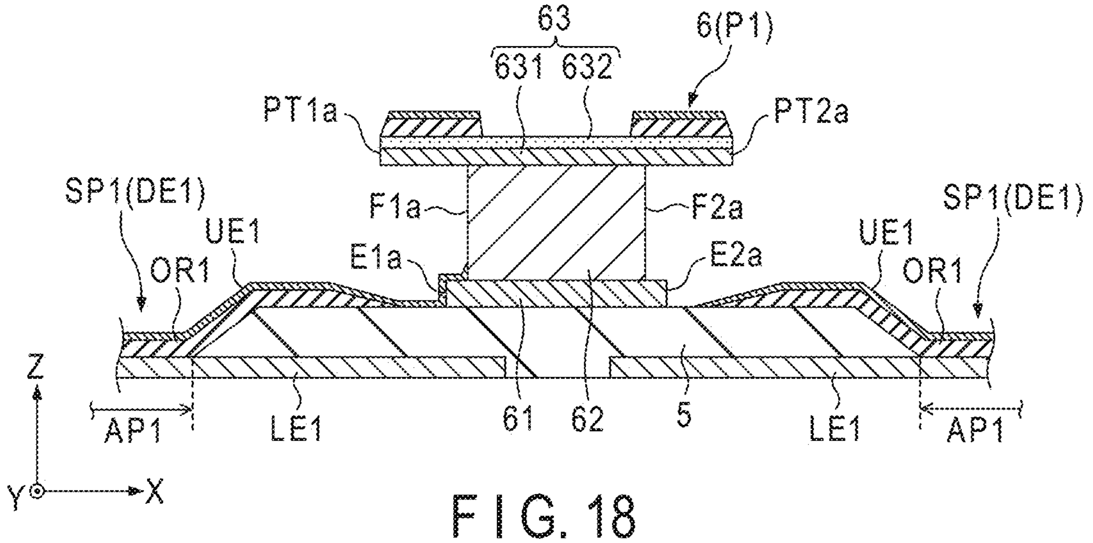
FIG. 18 is a schematic cross-sectional view of the first portion of a partition along the A-A line of FIG. 17.

FIG. 18 is a schematic cross-sectional view of the first portion P1 along the A-A line of FIG. 17. In the example of FIG. 18, both the first end portion E1*a* of the bottom portion 61 and the second end portion E2*a* of the bottom portion 61 are exposed from the stem portion 62. Thus, in the first portion P1, the entire stem portion 62 is located on the bottom portion 61 and is not in contact with a rib 5.

In the example of FIG. 18, the first end portion E1*a* protrudes from the first side surface F1*a* of the stem portion 62. The second end portion E2*a* protrudes from the second side surface F2*a* of the stem portion 62. The upper electrode UE1 located on the left side of the figure is in contact with the first end portion E1*a*. The upper electrode UE1 located on the right side of the figure is not in contact with the second end portion E2*a*. It should be noted that this upper electrode UE1 may be in contact with the second end portion E2*a*.

The configuration of the second portion P2 is similar to that of the first embodiment. Thus, the configuration of the second embodiment can also prevent the contact between the second portion P2 and the upper electrodes UE1, UE2 and UE3 or organic layers OR1, OR2 and OR3.

The configuration disclosed in the embodiment can be modified in various ways. Hereinafter, this specification shows modified examples of the second embodiment.

Fifth Modified Example

Figure 19:
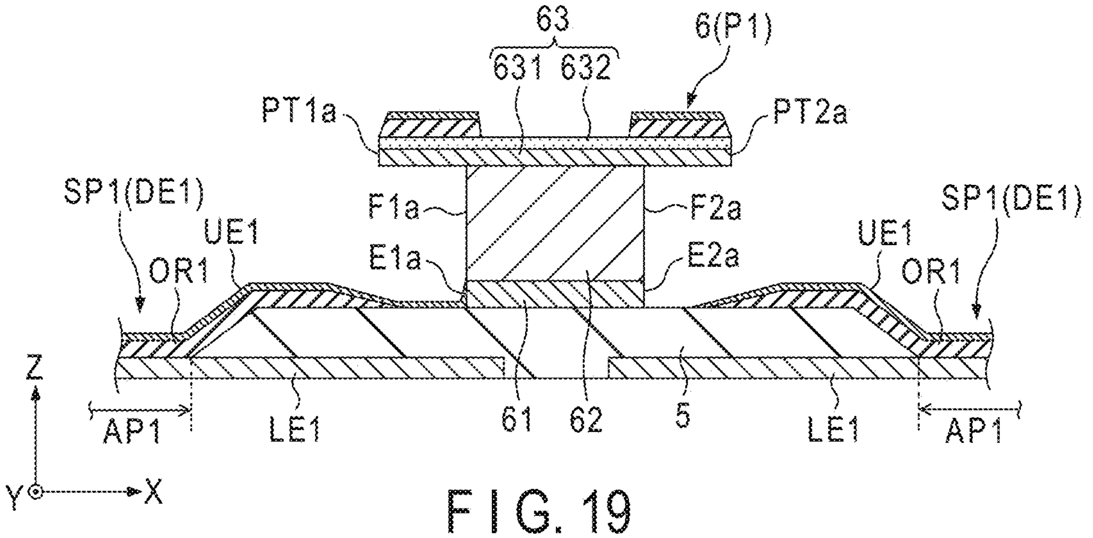
FIG. 19 is a cross-sectional view showing a fifth modified example.

FIG. 19 is a cross-sectional view showing a fifth modified example. This cross-sectional view shows a schematic configuration of the first portion P1 of the partition 6 in a manner similar to that of FIG. 18. In the example of FIG. 19, the first end portion E1*a* of the bottom portion 61 does not protrude from the first side surface F1*a* of the stem portion 62. The second end portion E2*a* of the bottom portion 61 does not protrude from the second side surface F2*a* of the stem portion 62. Thus, the first end portion E1*a* and the second end portion E2*a* are aligned with the first side surface F1*a* and the second side surface F2*a*, respectively, in a third direction Z.

Sixth Modified Example

In a manner similar to that of the third modified example described above, the stem portion 62 may be formed of an insulating material in the second embodiment. For the insulating material, for example, silicon nitride, silicon oxide or silicon oxynitride is considered. This modified example can be applied to either a case where the partition 6 comprises the first portion P1 shown in FIG. 18 or a case where the partition 6 comprises the first portion P1 shown in FIG. 19.

Seventh Modified Example

In the example of FIG. 17, the first portion P1 extends in the first direction X, and the second portion P2 extends in the second direction Y. However, in the layout of subpixels SP1, SP2 and SP3 of FIG. 17, the first portion P1 may extend in the second direction Y, and the second portion P2 may extend in the first direction X.

Third Embodiment

A third embodiment is explained. Configurations or effects which are not particularly referred to are the same as those of the first embodiment.

Figure 20:
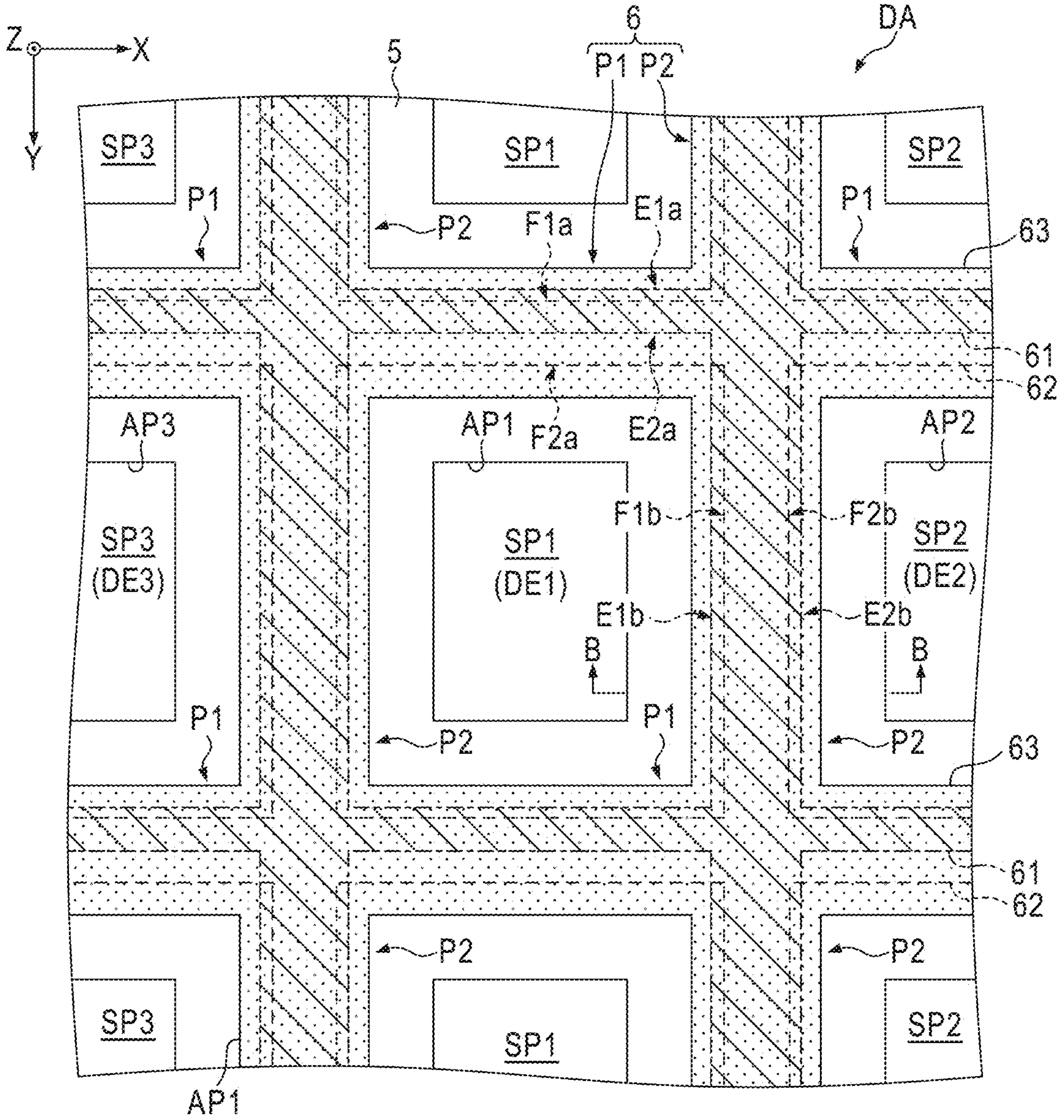
FIG. 20 is a schematic plan view of the display area of a display device according to a third embodiment.

FIG. 20 is a schematic plan view of the display area DA of a display device DSP according to the third embodiment. In this embodiment, in addition to the first portion P1 of a partition 6, a bottom portion 61 is provided in a second portion P2.

In the example of FIG. 20, the bottom portion 61 of the first portion P1 is continuous with the bottom portion 61 of the second portion P2. The bottom portion 61 has a grating shape which surrounds the pixel apertures AP1, AP2 and AP3 as a whole. However, the bottom portion 61 of the first portion P1 may be spaced apart from the bottom portion 61 of the second portion P2.

The configuration of the first portion P1 is similar to that shown in, for example, FIG. 2 and FIG. 4A. In the example of FIG. 20, the width of the bottom portion 61 of the second portion P2 is greater than that of the bottom portion 61 of the first portion P1.

Figure 21:
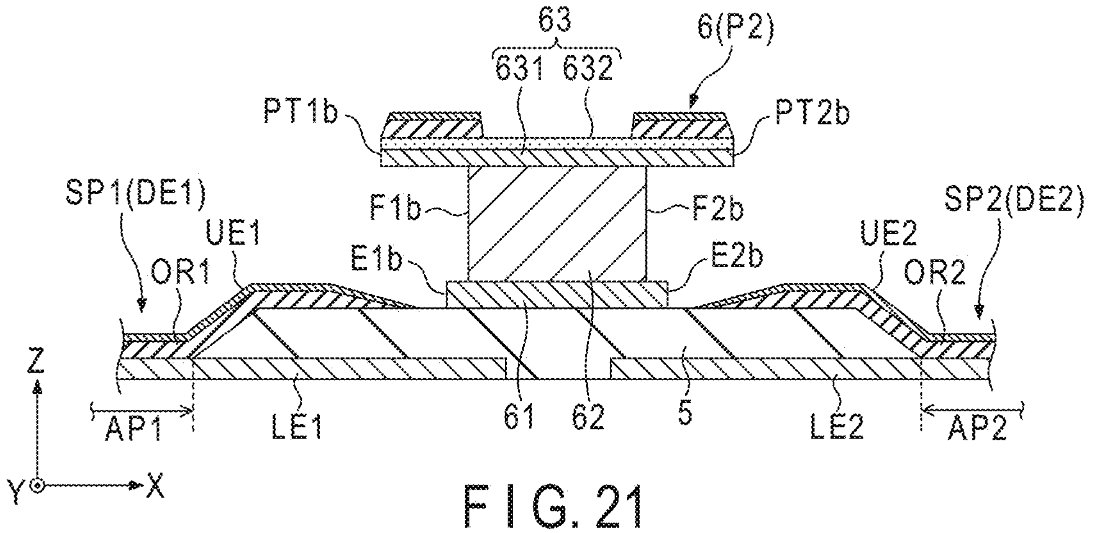
FIG. 21 is a schematic cross-sectional view of the second portion of a partition along the B-B line of FIG. 20.

FIG. 21 is a schematic cross-sectional view of the second portion P2 of the partition 6 along the B-B line of FIG. 20. In this figure, the elements other than a rib 5, the partition 6, lower electrodes LE1 and LE2, organic layers OR1 and OR2 and upper electrodes UE1 and UE2 are omitted.

The bottom portion 61 of the second portion P2 comprises a first end portion E1*b* and a second end portion E2*b* in a first direction X. Both the first end portion E1*b* and the second end portion E2*b* are exposed from a stem portion 62. Thus, in the second portion P2, the entire stem portion 62 is located on the bottom portion 61 and is not in contact with the rib 5. In the example of FIG. 21, the first end portion E1*b* protrudes from the first side surface F1*b* of the stem portion 62. The second end portion E2*b* protrudes from the second side surface F2*b* of the stem portion 62.

In this embodiment, similarly, as the partition 6 comprises the first portion P1, the contact of the upper electrodes UE1, UE2 and UE3 and the organic layers OR1, OR2 and OR3 relative to at least a side surface of the first portion P1 can be prevented.

The configuration disclosed in the embodiment can be modified in various ways. Hereinafter, this specification shows modified examples of the third embodiment.

Eighth Modified Example

Figure 22:
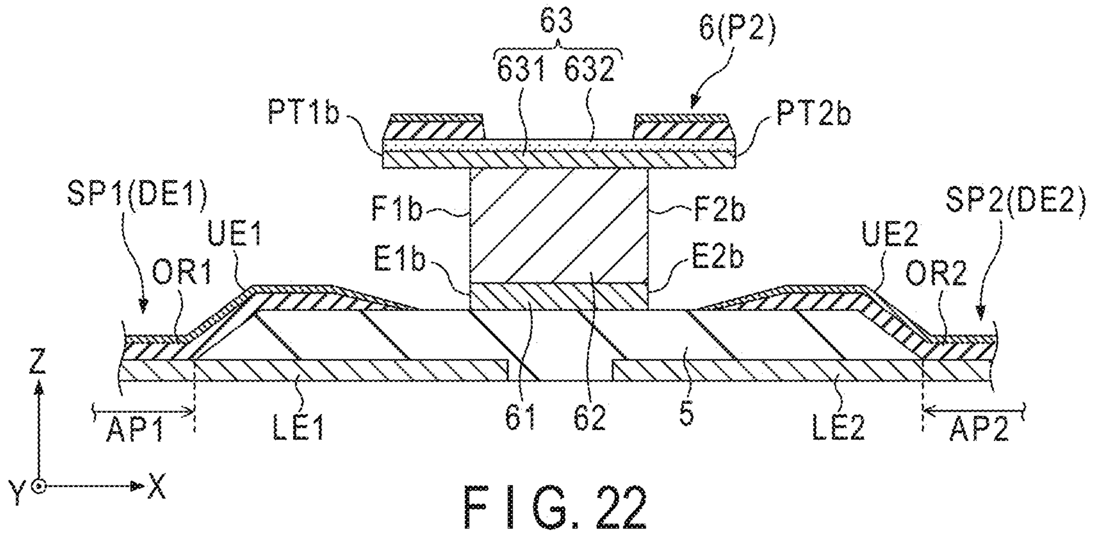
FIG. 22 is a cross-sectional view showing an eighth modified example.

FIG. 22 is a cross-sectional view showing an eighth modified example. This cross-sectional view shows a schematic configuration of the second portion P2 of the partition 6 in a manner similar to that of FIG. 21. In the example of FIG. 22, the first end portion E1*b* of the bottom portion 61 does not protrude from the first side surface F1*b* of the stem portion 62. The second end portion E2*b* of the bottom portion 61 does not protrude from the second side surface F2*b* of the stem portion 62. Thus, the first end portion E1*b* is aligned with the first side surface F1*b* in a third direction Z, and the second end portion E2*b* is aligned with the second side surface F2*b* in the third direction Z.

Ninth Modified Example

In a manner similar to that of the third modified example described above, the stem portion 62 may be formed of an insulating material in the third embodiment. For the insulating material, for example, silicon nitride, silicon oxide or silicon oxynitride is considered. This modified example can be applied to either a case where the partition 6 comprises the second portion P2 shown in FIG. 21 or a case where the partition 6 comprises the second portion P2 shown in FIG. 22.

Tenth Modified Example

In the example of FIG. 20, the first portion P1 extends in the first direction X, and the second portion P2 extends in a second direction Y. However, in the layout of subpixels SP1, SP2 and SP3 of FIG. 20, the first portion P1 may extend in the second direction Y, and the second portion P2 may extend in the first direction X.

Fourth Embodiment

A fourth embodiment is explained. Configurations or effects which are not particularly referred to are the same as those of the first embodiment.

Figure 23:
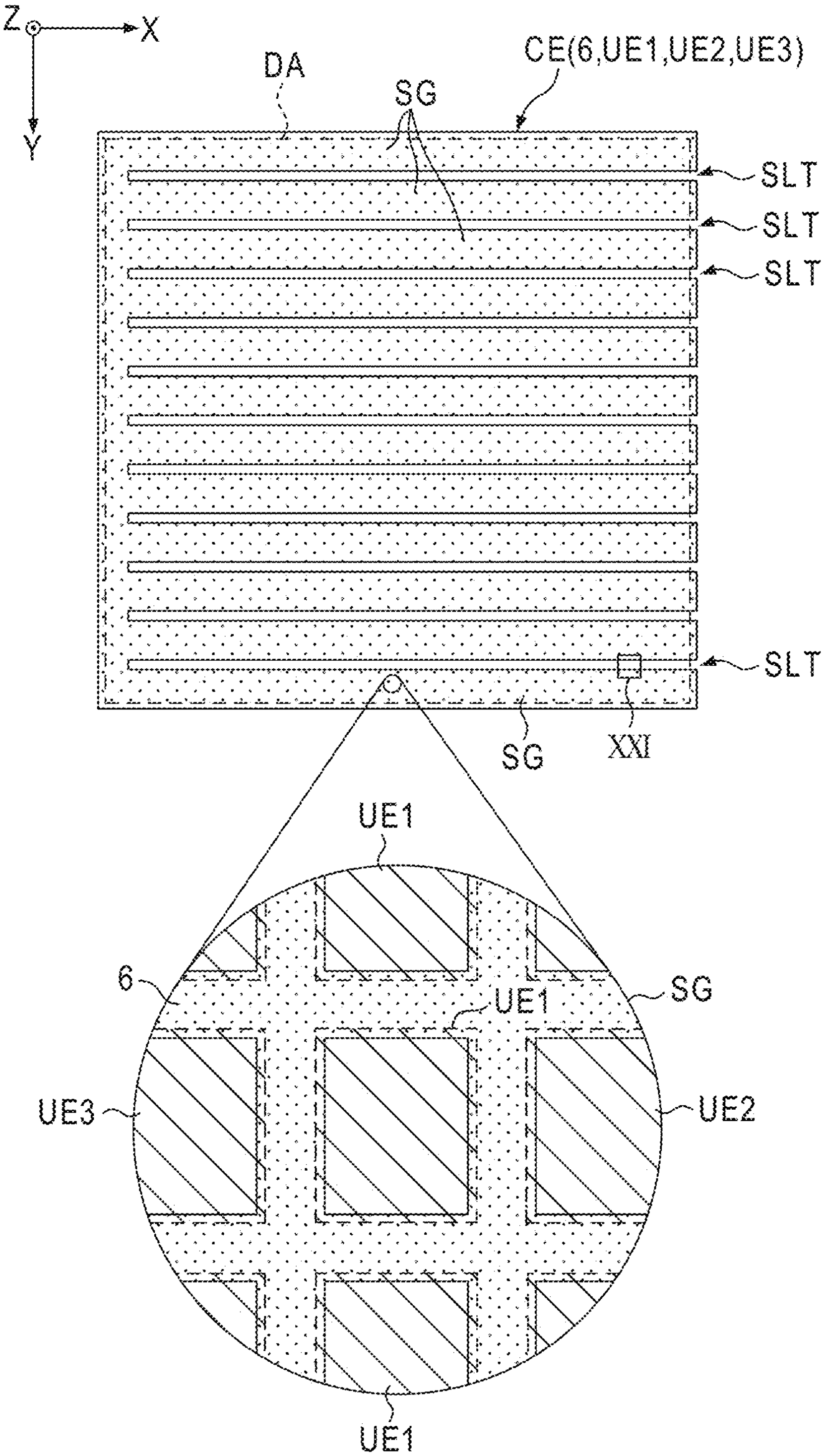
FIG. 23 is a schematic plan view of the display area of a display device according to a fourth embodiment.

FIG. 23 is a schematic plan view of the display area DA of a display device DSP according to the fourth embodiment. A common electrode (cathode electrode) CE is provided in the display area DA. As shown in the enlarged view on the lower side of the figure, the common electrode CE consists of a partition 6 and upper electrodes UE1, UE2 and UE3.

An electronic device including the display device DSP may comprise an antenna for near field communication (NFC). The antenna could be provided so as to overlap the display area DA. In this case, when the common electrode CE covers the entire display area DA, and has a low resistance, there is a possibility that the sensitivity of communication by the antenna is decreased because of eddy current generated in the common electrode CE at the time of communication.

To solve this problem, in the example of FIG. 23, a plurality of slits SLT are provided in the common electrode CE. By providing the slits SLT, the resistance of the common electrode CE is increased, and the generation of eddy current is prevented. By this configuration, the improvement of communication sensitivity can be expected.

In the example of FIG. 23, each slit SLT extends in a first direction X. Further, these slits SLT are arranged in a second direction Y. The common electrode CE is divided into a plurality of segments SG by the slits SLT. In the example of FIG. 23, ends of these segments SG are connected to each other.

Figure 24:
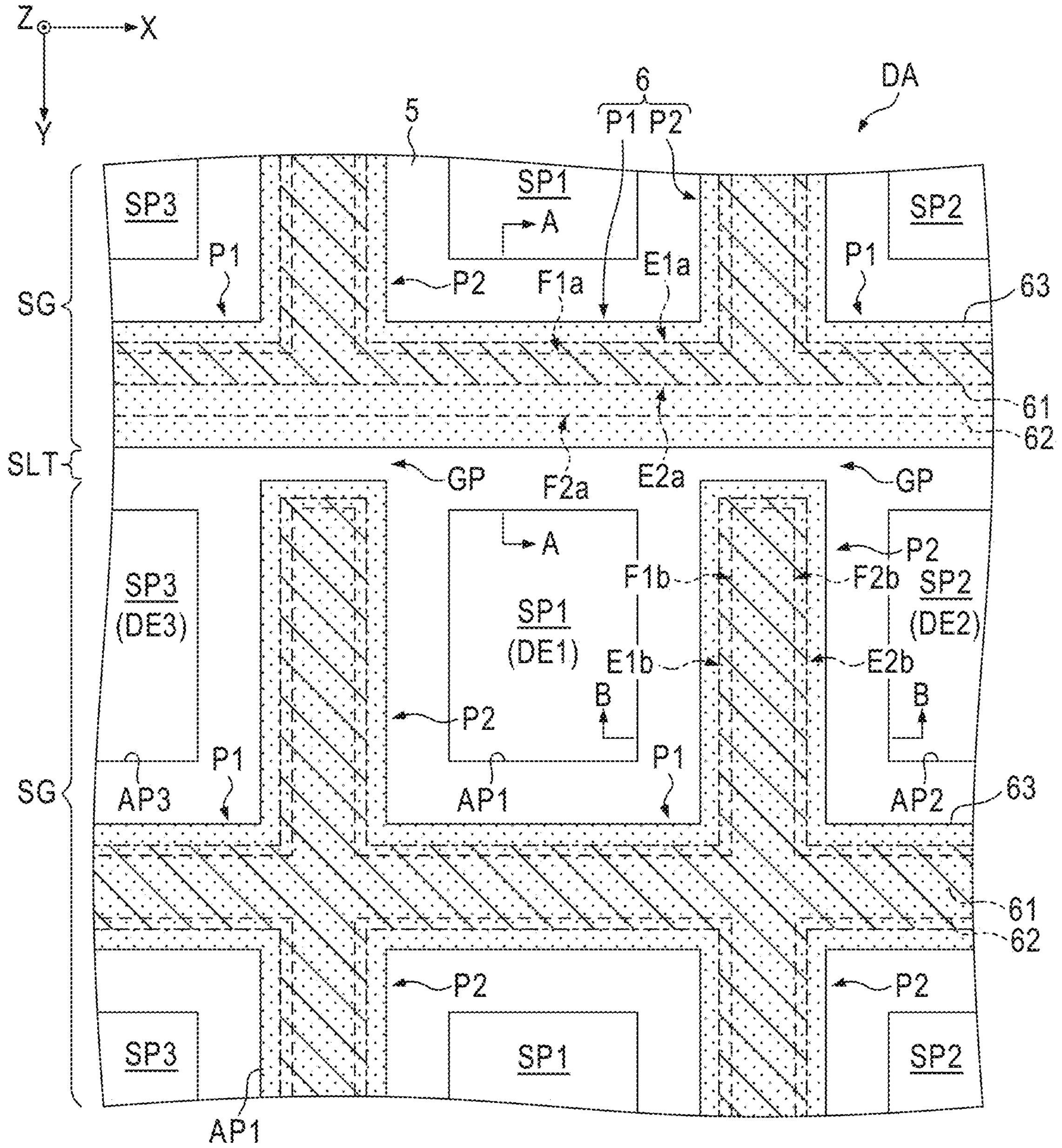
FIG. 24 is a schematic plan view in which the area surrounded by frame XXI in FIG. 23 is enlarged.

FIG. 24 is a schematic plan view in which the area surrounded by frame XXI in FIG. 23 is enlarged, and shows the structures of two segments SG and the slit SLT between these segments SG.

In the example of FIG. 24, a first portion P1 is spaced apart from a second portion P2 via a gap GP in an area corresponding to the slit SLT. The sectional structure of the first portion P1 along the A-A line in FIG. 24 is similar to, for example, FIG. 4A. Specifically, the first end portion E1*a* of a bottom portion 61 protrudes relative to the first side surface F1*a* of a stem portion 62, and the second end portion E2*a* of the bottom portion 61 is covered with the stem portion 62. In the slit SLT, upper electrodes UE1, UE2 and UE3 are spaced apart from the bottom portion 61 and stem portion 62 of the first portion P1.

The sectional structure of the second portion P2 along the B-B line of FIG. 24 is similar to, for example, the example of FIG. 21. Specifically, the first end portion E1*b* of the bottom portion 61 protrudes relative to the first side surface F1*b* of the stem portion 62, and the second end portion E2*b* of the bottom portion 61 protrudes relative to the second side surface F2*b* of the stem portion 62.

The gap GP is formed between the second side surface F2*a* of the stem portion 62 in the first portion P2 (in other words, the side surface from which the bottom portion 61 does not protrude) and the second portion P2. Thus, the second portion P2 faces the second side surface F2*a* via the gap GP in the second direction Y.

If the two segments SG divided from each other by the slit SLT are connected by the upper electrodes UE1, UE2 and UE3, the effectiveness of the improvement of communication sensitivity by the slit SLT is lost. However, when the slit SLT is formed along the non-contact side (second side surface F2*a*) of the first portion P1 as shown in FIG. 23, the contact of two segments SG by the upper electrodes UE1, UE2 and UE3 can be satisfactorily prevented.

The configuration disclosed in the embodiment can be modified in various ways. Hereinafter, this specification shows modified examples of the fourth embodiment.

Eleventh Modified Example

In a manner similar to that of the second modified example described above (see FIG. 16), the first end portion E1*a* of the bottom portion 61 of the first portion P1 may not protrude from the first side surface F1*a* of the stem portion 62. Further, in a manner similar to that of the eighth modified example described above (see FIG. 22), the first and second end portions E1*b* and E2*b* of the bottom portion 61 of the second portion P2 may not protrude from the first and second side surfaces F1*b* and F2*b* of the stem portion 62, respectively.

Twelfth Modified Example

In a manner similar to that of the third modified example described above, the stem portion 62 may be formed of an insulating material in the fourth embodiment. For the insulating material, for example, silicon nitride, silicon oxide or silicon oxynitride is considered.

Thirteenth Modified Example

In the example of FIG. 24, the first portion P1 extends in the first direction X, and the second portion P2 extends in the second direction Y. However, in the layout of subpixels SP1, SP2 and SP3 of FIG. 24, the first portion P1 may extend in the second direction Y, and the second portion P2 may extend in the first direction X. In this case, the slit SLT is formed along the second direction Y.

All of the display devices that can be implemented by a person of ordinary skill in the art through arbitrary design changes to the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:
a lower electrode;
a rib having a pixel aperture which overlaps the lower electrode;
a partition which comprises a conductive bottom portion provided on the rib, a stem portion provided on the bottom portion, and a top portion provided on the stem portion and protruding from a side surface of the stem portion, and surrounds the pixel aperture;
an organic layer which covers the lower electrode through the pixel aperture and emits light based on application of voltage; and
an upper electrode which covers the organic layer, wherein
the partition includes a first portion extending in a first direction,
the bottom portion of the first portion comprises a first end portion on a pixel aperture side, and a second end portion located on a side opposite to the first end portion in a second direction intersecting with the first direction,
the first end portion is exposed from the stem portion, and
the second end portion is covered with the stem portion.

2. The display device of claim 1, wherein
the upper electrode is in contact with the first end portion.

3. The display device of claim 1, wherein
the partition further includes a second portion which extends in the second direction, and
the second portion does not comprise the bottom portion.

4. The display device of claim 1, further comprising a plurality of subpixels each comprising the lower electrode, the organic layer and the upper electrode, wherein
the partition has a grating shape which surrounds the subpixels, and
the bottom portion continuously extends over the subpixels.

5. The display device of claim 1, further comprising a plurality of subpixels each comprising the lower electrode, the organic layer and the upper electrode, wherein
the partition has a grating shape which surrounds the subpixels, and
the bottom portion having an island-like shape is provided for each of the subpixels.

6. The display device of claim 1, wherein
the partition further includes a second portion which extends in the second direction, and
both end portions of the bottom portion of the second portion are exposed from the stem portion.

7. The display device of claim 6, wherein
a width of the bottom portion of the second portion is greater than a width of the bottom portion of the first portion.

8. The display device of claim 1, wherein
the partition further includes a second portion which extends in the second direction,
the stem portion of the first portion comprises a first side surface from which the bottom portion protrudes, and a second side surface which is located on a side opposite to the first side surface in the second direction and from which the bottom portion does not protrude, and
the second portion faces the second side surface via a gap in the second direction.

9. The display device of claim 1, wherein
the first end portion protrudes from the side surface of the stem portion.

10. The display device of claim 1, wherein
the first end portion is aligned with the side surface of the stem portion.

11. The display device of claim 1, wherein
the stem portion is formed of a conductive material.

12. The display device of claim 1, wherein
the stem portion is formed of an insulating material.

13. A display device comprising:
a lower electrode;
a rib having a pixel aperture which overlaps the lower electrode;
a partition which comprises a conductive bottom portion provided on the rib, a stem portion provided on the bottom portion, and a top portion provided on the stem portion and protruding from a side surface of the stem portion, and surrounds the pixel aperture;
an organic layer which covers the lower electrode through the pixel aperture and emits light based on application of voltage; and
an upper electrode which covers the organic layer, wherein
the partition includes a first portion extending in a first direction and a second portion extending in a second direction intersecting with the first direction,
in the first portion, the bottom portion, the stem portion and the top portion are stacked, and
in the second portion, the stem portion and the top portion are stacked, and the bottom portion is not provided under the stem portion.

14. The display device of claim 13, wherein
the bottom portion of the first portion comprises a first end portion on a pixel aperture side, and a second end portion located on a side opposite to the first end portion in the second direction,
the first end portion is exposed from the stem portion, and
the upper electrode is in contact with the first end portion.

15. The display device of claim 14, wherein
the second end portion is covered with the stem portion.

16. The display device of claim 14, wherein
the second end portion is exposed from the stem portion.

17. The display device of claim 14, wherein
the first end portion protrudes from the side surface of the stem portion.

18. The display device of claim 14, wherein
the first end portion is aligned with the side surface of the stem portion.

19. The display device of claim 13, wherein
the stem portion is formed of a conductive material.

20. The display device of claim 13, wherein
the stem portion is formed of an insulating material.

* * * * *